(12) United States Patent
Tanaka et al.

(10) Patent No.: US 7,040,011 B2
(45) Date of Patent: May 9, 2006

(54) WIRING SUBSTRATE MANUFACTURING METHOD

(75) Inventors: Toshihiko Tanaka, Tokyo (JP);
Masaharu Kubo, Hachioji (JP);
Takashi Hattori, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/045,036

(22) Filed: Jan. 15, 2002

(65) Prior Publication Data
US 2002/0100164 A1 Aug. 1, 2002

(30) Foreign Application Priority Data
Jan. 29, 2001 (JP) ............... 2001-019774

(51) Int. Cl.
*H05K 3/30* (2006.01)
(52) U.S. Cl. .................. 29/832; 29/846; 29/847; 430/5; 430/319; 430/321; 977/DIG. 1
(58) Field of Classification Search .............. 29/832, 29/846, 847; 430/319, 321, 323, 5; 216/48; 219/121.6; 427/552; 977/DIG. 1
See application file for complete search history.

(56) References Cited

U.S. PATENT DOCUMENTS

| | | | | |
|---|---|---|---|---|
| 4,465,749 A | * | 8/1984 | May et al. | 430/54 |
| 5,635,336 A | * | 6/1997 | Bae | 430/314 |
| 5,666,177 A | * | 9/1997 | Hsieh et al. | 349/111 |
| 5,718,991 A | * | 2/1998 | Lin et al. | 430/5 |
| 5,871,870 A | * | 2/1999 | Alwan | 430/5 |
| 6,007,969 A | * | 12/1999 | Hatakeyama et al. | 430/323 |
| 6,370,441 B1 | * | 4/2002 | Ohnuma | 700/121 |

FOREIGN PATENT DOCUMENTS

| | | | |
|---|---|---|---|
| JP | 5-289307 | | 11/1993 |
| JP | 05-289307 | * | 11/1993 |
| JP | 8-255981 | | 10/1996 |
| JP | 09-321184 | * | 12/1997 |
| JP | 9-321184 | | 12/1997 |

* cited by examiner

*Primary Examiner*—A. Dexter Tugbang
*Assistant Examiner*—Tim Phan
(74) *Attorney, Agent, or Firm*—Miles & Stockbridge P.C.

(57) ABSTRACT

A wiring substrate is manufactured in short TAT.

Wirings of the wiring substrate are formed by an exposure treatment using a photomask which has shade patterns each containing at least nano particles and a binder.

14 Claims, 21 Drawing Sheets

WIRING SUBSTRATE MANUFACTURING METHOD

CROSS REFERENCE TO RELATED DOCUMENT

This application claims the benefit of Japanese Patent Applications No. 2001-019774, filed on Jan. 29, 2001.

BACKGROUND OF THE INVENTION

The present invention relates to a wiring substrate manufacturing technique and particularly relates to a technique effectively applied to a manufacturing method for a wiring substrate used in a semiconductor device.

A wiring substrate is described in, for example, Japanese Patent Laid-Open No. 9-321184. Japanese Patent Laid-Open No. 9-321184 discloses a connection substrate (wiring substrate) for connecting a high wiring density semiconductor chip to a low wiring density printed wiring substrate and a manufacturing technique thereof. This connection substrate consists of a photosensitive glass plate, and one wiring layer to which bumps of the semiconductor chip are connected is formed on the upper surface of the connection substrate. In addition, a plurality of bumps connected to electrodes of the printed wiring substrate are formed on the lower surface of the connection substrate. Wirings on the upper surface of the connection substrate are electrically connected to the bumps on the lower surface thereof, through via holes penetrating the upper and lower surfaces of the connection substrate. These via holes are formed by a photolithographic technique, and a conductor is embedded into each via hole by plating.

Also, a technique for forming microstructure via holes and wirings on a glass plate by using an exposure treatment of a photosensitive material with ultraviolet rays is disclosed by, for example, Japanese Patent Laid-Open No. 8-255981. According to Japanese Patent Laid-Open No. 8-255981, a shade film made of metal such as Ti, Cr, Al, Ni, W, Mo, Ta or Cu is formed on the glass plate, thereby preventing UV multiple reflection between the upper and lower surfaces of the glass plate during the exposure treatment for the photosensitive material. In addition, by setting the film thickness of the shade film made of one of the above-stated metal at not more than 3 μm, the thermal conductivity of the glass plate is improved.

SUMMARY OF THE INVENTION

The inventors of the present invention, however, have discovered that the above-stated wiring substrate techniques have the following disadvantages.

That is, a wiring substrate provided for mounting electronic components is required to carefully deal with each of varied purposes. A wiring substrate mounted in a semiconductor device is particularly required to correspond to each of various types of semiconductor devices in small quantities. To do so, a technique for manufacturing a wiring substrate in short TAT (TURN AROUND TIME) or a technique for manufacturing a wiring substrate at low cost is required.

An object of the present invention is to provide a technique capable of manufacturing a wiring substrate in short TAT.

Another object of the present invention is to provide a technique capable of manufacturing a wiring substrate at low cost.

The above and other objects of the present invention and novel features thereof will be readily apparent from the description of the present specification and accompanying drawings.

Among the inventions disclosed in the present application, a typical invention will be outlined briefly as follows.

That is, the present invention includes a step of forming wirings on a wiring substrate, by an exposure treatment employing a photomask having shade patterns each containing at least nano particles and a binder.

DETAILED DESCRIPTION OF THE PREFERRED EMBODIMENTS

Figure 1A:
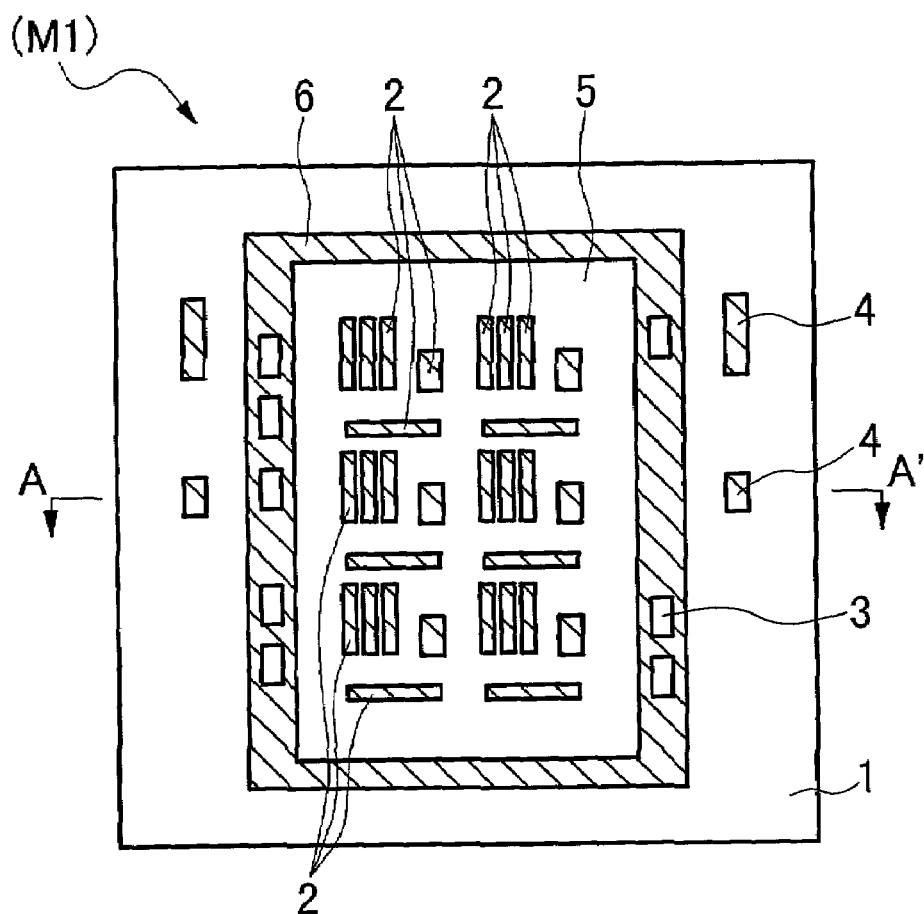
FIG. 1A is a plan view showing a photomask M1 manufactured in a photomask manufacturing example 1 that is one embodiment of the present invention.

The embodiments of the present invention will be described while dividing one embodiment into a plurality of sections or a plurality of embodiments if necessary for the sake of convenience. It is noted, however, that they are not irrelevant to one another but one is the modification, detail, additional description of a part of or all of the others unless defined otherwise.

Further, in the following embodiments, unless the number of components thereof and the like (including the number, numerical values, quantities, ranges and the like) are referred to or unless particularly the number of components and the like are designated or obviously specified by the specific numbers, they should not be limited to the specific numbers but may be not less than or not more than the specific numbers.

Moreover, it goes without saying that these components (including constituent steps and the like) are not necessarily essential unless they are specially designated or obviously considered to be essential in principle in the following embodiment.

Likewise, in the following embodiments, if referring to the shapes, positional relationships and the like of the components and the like, they include those substantially approximate or similar to the shapes and the like. The same thing is true for the numerical values and ranges thereof stated above.

Moreover, components having the same functions are denoted by the same reference symbols and no repetitive description will be given thereto throughout all the drawings.

In addition, in the drawings used for the embodiments of the present invention, even plan views showing shade sections (a shade film, a shade pattern, a shade area and the like) are hatched so as to make the drawings easy understood.

The embodiments of the present invention will be described hereinafter in detail with reference to the drawings.

First, a photomask (to be simply referred to as "mask" hereinafter) employed in the manufacturing of a wiring substrate in the embodiments will be described.

[Mask Manufacturing Example 1]

A mask shown in the mask manufacturing example 1 will be named "mask M1" for the sake of convenience.

Figure 1B:
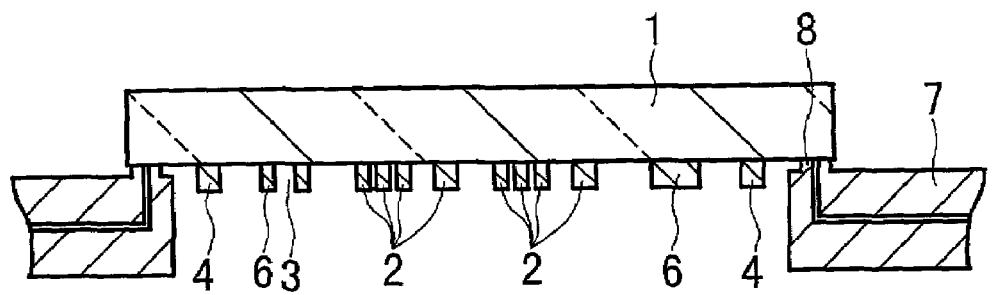
FIG. 1B is a cross-sectional view taken along line A–A' of FIG. 1A.

FIGS. 1A and 1B are a plan view and a cross-sectional view of the mask M1 manufactured in the method of the present invention, respectively. FIG. 1A is a plan view and FIG. 1B is a cross-sectional view taken along line A–A' of FIG. 1A when the mask M1 is mounted (or set) on an aligner. Reference numeral 1 denotes an optical glass plate, 2 denotes a shade pattern containing at least nano particles and a binder, 3 denotes a wafer alignment mark used when layers are aligned to one another, 4 denotes a mask alignment mark for grasping an accurate position of the mask, 5 denotes a circuit pattern area, 6 denotes a shade band which is an area corresponding to a scribe line or the like, 7 denotes a mask stage of the aligner, and 8 denotes a contact face between the mask stage 7 and the mask M1.

In this example, the shade pattern 2 containing at least nano particles and a binder is not formed on a portion on which the mask stage 7 contacts with a mask handling system (not shown). This is because if the shade pattern 2 is formed on this contact face, the shade pattern 2 is peeled off during the contact between the mask stage 7 and the mask handling system to thereby cause a foreign matter defect.

During exposure, an exposure light beam is illuminated from an upper side of FIG. 1B and transferred onto the substrate (wiring substrate) through a projection lens (not shown) which is put in a lower surface side thereof. On portions on which the shade pattern 2 containing at least nano particles and a binder is formed, the nano particles in place of metal such as chromium or the like used as an ordinary mask shade pattern, scatter and shade light. In case of the mask M1 manufactured in the manufacturing example 1, the nano particles contained in the shade pattern 2 scatter optical energy illuminated. A part of the optical energy is absorbed by the nano particles. However, since the optical energy is mainly scattered rather than absorbed, an amount of energy stored in the shade pattern 2 is low. Due to this, it is difficult to cause deterioration such as change of reduction in a shading rate of light beam of the shade pattern 2, or decrease in mechanical strength of the shade pattern 2, or the like.

The shade band 6 and the mask alignment marks 4 are composed of the shade pattern containing at least nano particles and a binder in this example, but it may be composed of metal such as chromium or the like.

Figure 2A:
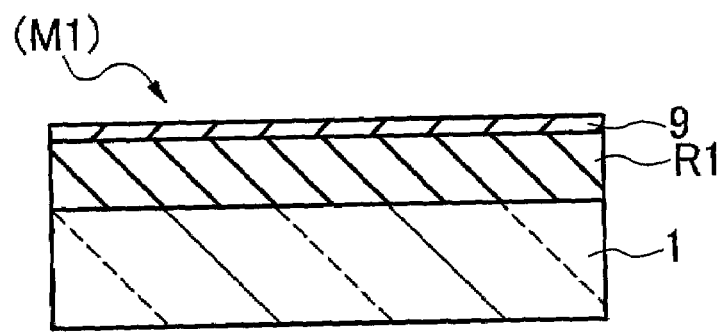
FIG. 2A is a cross-sectional view showing an important part during manufacturing steps of manufacturing the photomask M1 shown in FIGS. 1A and 1B.
Figure 2B:
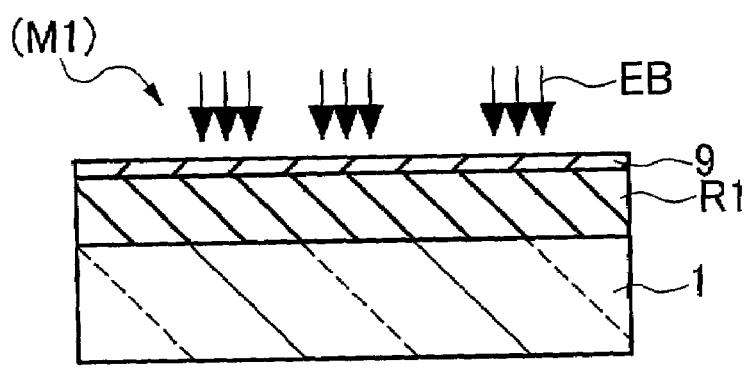
FIG. 2B is a cross-sectional view showing an important part during manufacturing steps of manufacturing the photomask M1 shown in FIGS. 1A and 1B.

Next, a method for manufacturing the mask M1 in this manufacturing example 1 will be described with reference to FIGS. 2A to 2C which are cross-sectional views showing important parts in the manufacturing steps of the mask M1. First, as shown in FIG. 2A, a resist R1 having carbon dispersed thereinto, as a resist material (I) for forming the shade pattern containing at least nano particles and a binder is spin-coated, on an optical glass plate (blanks) 1, and, for example, baked for two minutes at 100° C., and thereby a coating film having a thickness of 600 nm is obtained. Thereafter, as shown in FIG. 2B, a water soluble conductive layer 9 is coated, and a desired pattern is written with electron beams EB by using an electron beam writing device. The reason for widely coating the water soluble conductive film 9 is to prevent charge-up thereof during writing.

A preparation method for preparing a material of the above resist R1 is, for example, as follows. The resist (I) having carbon that contains a solid rate of 16% and is dispersed therein is prepared by adding propylene glycol methyl ether acetate (PGMEA) used as a solvent, to 10 g of polyhydroxystyrene (weight average molecular weight of about 20,000), 4 g of 2,6-bis(4-azidebenzal)acetone-2,2'-disulfonic acid-N,N'-diethylene oxy ethyl amide, 75 g of carbon black dispersion (carbon black particle diameter of about 20 nm, and carbon black content rate of 20 wt %) using a solvent as PGMEA, 1.5 g of hexamethoxymethylmelamine.

Figure 3:
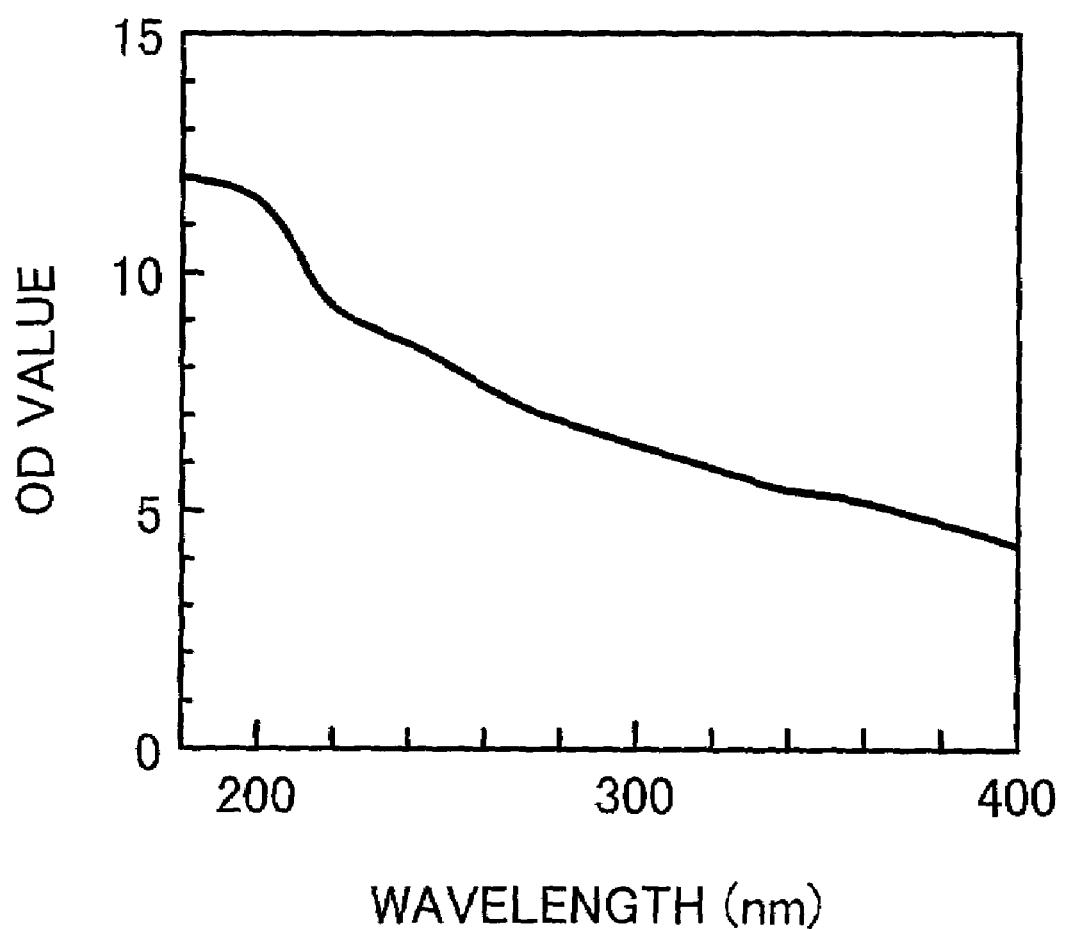
FIG. 3 is an explanatory view showing a spectral characteristic of a carbon-dispersed resist (I) of the photomask M1 shown in FIG. 1.

In case of the carbon-dispersed resist used herein, carbon fine particles dispersed in the resist film scatter light and prevent transmission of light. An OD value of the resist (I) that has a film thickness of 1.0 μm and in which carbon separately measured by a spectrophotometer is dispersed is shown in FIG. 3. The OD value means a value expressed by $-\log_{10}(Iout/Iin)$ where Iin represents incident light and Iout represents transmission light. Also, since transmittance T % is given by 100×Iout/Iin, OD value is expressed as the OD=−log(T/100). In case of the carbon-dispersed resist (I) prepared in the manufacturing example 1, since the dispersed carbon fine particles function as scatterers, the transmission of light is suppressed. Under the film thickness of 1.0 μm, the OD value is 5.0 at 365 nm of i-line has an exposure wavelength.

Figure 2C:
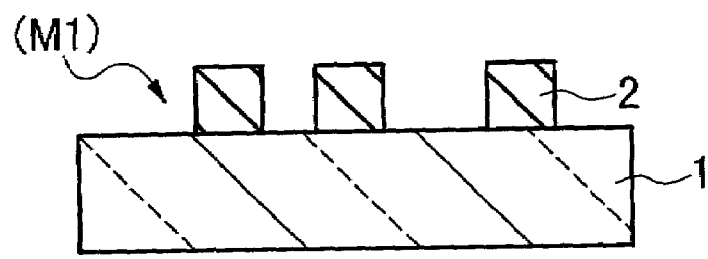
FIG. 2C is a cross-sectional view showing an important part during manufacturing steps of manufacturing the photomask M1 shown in FIGS. 1A and 1B.

After the electron beam writing, as shown in FIG. 2C, development is performed by using, as a surfactant, 2.38 wt % of tetramethyl ammonium hydroxide (TMAH) containing 0.3 wt % of dodecylsulfate sodium salt, and thereby a shade pattern 2 containing at least carbon is formed. Since an anti-static film used herein is water solvent, the film is removed simultaneously at the time of the development of the resist pattern. The carbon-dispersed resist (I) is a negative resist and a desired pattern having a minimum size of 0.8 μm is formed. As a result, a mask M1 with the shade pattern 2 having a desired shape and containing carbon black fine particles is formed.

The mask M1 thus formed has an OD value of 3.0 at a light beam with a wavelength of 365 nm and transmittance of 0.10%. Since the mask Ml has a broader shading characteristic, it can shade not only the light beam having a wavelength of 365 nm but also that of 405 nm and that of 436 nm. It is also possible to shade light beams having longer wavelengths. Due to this, it is further possible to perform exposure using not only light having a single wavelength like an i-line but also light having a multiple wavelength such as a mercury lamp or the like.

After the development, a heat treatment is performed to improve resistance to exposure light when the mask M1 is used. In this case, heat treatment temperature is set at, for example, 120° C. whose a temperature is only one example, and the heat treatment temperature is changed based on the material of a resist. Preferably, the heat treatment is performed at as high temperature as possible, within such a temperature range that the resist pattern is not deformed. It is noted that the film thickness and the transmittance thereof are hardly changed by this heat treatment.

The mask M1 formed in this manufacturing example 1 can be formed through the coating, exposure and development of the organic film, and there is no requirement for a sputtering step using a vacuum apparatus and an etching step of etching a chromium film at the time of widely coating a chromium film. Therefore, the yield of manufacturing the mask becomes high. In addition, even after use of the mask M1, in the case where carbon black is employed as nano particles similarly to this embodiment, it is possible to completely regenerate the state of the optical glass plate (blanks) 1 by ashing or a solvent treatment. The mask M1 is, therefore, effective in the recycle of resources. Besides, if it is necessary to manufacture the mask M1 again, the mask M1 can be manufactured in a short time.

An i-line positive resist formed of novolac resin and diazonaphthoquinone is coated up to a film thickness of 1.0 μm on a wiring substrate which is subjected to an HMDS treatment, and is pre-baked, for example, at 90° C. for 90 seconds. Next, the resist film is exposed with an i-line stepper, through the i-line mask M1 having the shade pattern consisting of the resist (I) with the above-stated carbon dispersed therein. After the exposure, the resist is baked, for example, at 110° C. for 90 seconds, and developed with, for example, a 2.38 wt % tetra methyl ammonium hydroxide solution at 23° C. for 60 seconds. As a result, a wiring circuit pattern (wiring) of 500 nm is formed.

In this example, an electron beam writing device is used as a writing device for the mask M1. The writing device is not limited to the electron beam writing device, and may use a drawing device employing a light beam such as a laser writer or the like. In this case, the shade pattern 2 of, for example, about 10 to 20 μm can be formed on the optical glass plate 1. Further, in the writing device employing a light beam, there arises no problem of charge-up thereof, so that it is unnecessary to coat a water soluble conductive film and possible to shorten the manufacturing steps of manufacturing the mask M1. The above-mentioned electron beam writing device, on the other hand, has an advantage of high resolution.

Further, in this example, the optical glass plate is employed as a substrate of the mask M1. As the optical glass plate, a transparent material whose refractive index is nearly uniform may be used, for example, a quartz glass, a low expansion glass (LE glass), a soda lime (SL) glass or the like can be used. Since being low in coefficient of thermal expansion and high in light transmittance, a quartz glass has high advantages where transfer performances such as positional accuracy and resolution and the like is high, and a positional distortion during exposure is low in comparison with the LE glass. The LE glass has advantages of being less expensive than the quartz glass in price and lower in positional distortion during exposure than the SL glass. Also, the SL glass has an advantage of being less expensive than the LE glass in price. Although these substrates are used according to necessary transfer accuracy, manufacture of most of the wiring substance suffices to employ a substrate material other than a quartz glass.

Furthermore, in case of the mask M1 manufactured in the manufacturing example 1, carbon fine particles are employed as nano particles, but are not limited thereto. Nano particles having a particle diameter of 200 nm or less and scattering light may be used, i.e., nano particles irregularly reflecting light may be used. It is noted, however, that a sheet composed of a metal such as chromium or the like which is flat in a smooth surface or a roughed surface thereof is not included. Nano particles contained in the shade pattern 2 disperse light and thereby prevent transmission of light, so that the nano particles function as a mask M1. Nano particles contained in the shade pattern 2 manufactured in the manufacturing example 1 are exemplified by inorganic fine particles. To be specific, in addition to carbon black, carbon fine particles such as graphite, and metallic oxide fine particles such as titanium oxide, aluminum oxide, zinc oxide or the like, and metallic nano particles such as aluminum, gold, silver, copper or the like may be used. Among them, carbon black and graphite have advantages in that they can be removed by ashing and the optical glass plate (blanks) 1 can be easily regenerated.

Furthermore, the binder that is used in the mask M1 manufactured in the manufacturing example 1 is used to bind the above-stated nano particles to one another and thereby to form a film, and can be exemplified by high molecular compounds or organic compounds. At the time of forming the mask M1 manufactured in the manufacturing example 1, the shade pattern 2 is formed by using active radiation. It is, therefore, preferable that the binder employed in the manufacturing example 1 has some sort of photosensitivity to the radiation, i.e., is a resist material.

[Mask Manufacturing Example 2]

A mask shown in the mask manufacturing example 2 will be named "mask M2" for the sake of convenience.

The manufacturing example 2 for manufacturing the mask M2 is basically conformable to the manufacturing example 1 for manufacturing the mask M1. However, the manufacturing example 2 employs a chemical amplification type electron beam resist containing, as a base resin, a novolac resin which adds 2-(2'hydroxy-5'-methoxyphenyl)benzotriazol as an exposure light absorber in place of the resist R1 used in the manufacturing example 1 for manufacturing the mask M1. The film thickness of this chemical amplification type electron beam resist is set at 2 μm. The 2 μm film thickness of the resist adversely influences a transfer characteristic thereof, in a shade band of the mask for a pre-step of an IC (INTEGRATED CIRCUIT) having a minimum circuit size of 0.5 μm or less, and mask linearity, focal depth and resolution thereof deteriorate. However, since even an uppermost layer (a side of electronic-component-mounting surface) that has the smallest size in the wiring substrate has the minimum size of 1 μm, this film thickness is allowable by taking into account the fact that the reduction ratio of the lens of an aligner is 2.5. By adding the exposure light absorber to increase the film thickness of the resist shade band, the transmittance of light beam having a wavelength of 365 nm as exposure light can be set at 1% and functioned as the shade band of the mask M2. As exposure light absorber, for example, 2-(2'hydroxy-5'-methoxyphenyl) benzotriazol, light absorbers having coumarin structure, stilbene structure, chalcone structure, anthracene structure, benzylideneindene structure of azobenzene structure is used. As a light absorber, 2-hydroxychalcone, 4-hydroxyazobenzene, 4-hydroxybenzylideneindene or the like is used.

[Mask Manufacturing Example 3]

A mask shown in the mask manufacturing example 3 will be named "mask M3" for the sake of convenience.

Figure 4A:
FIG. 4A is a cross-sectional view of an important part during manufacturing steps in a photomask manufacturing example 3 which is another embodiment of the invention.
Figure 4B:
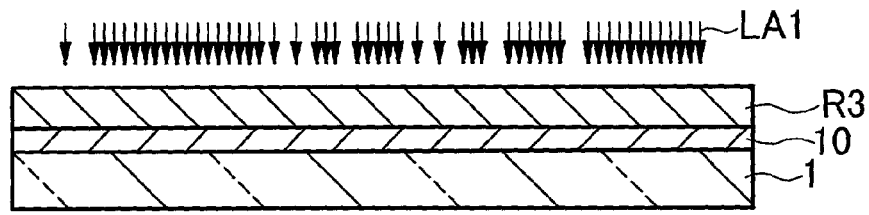
FIG. 4B is a cross-sectional view of an important part during manufacturing steps in a photomask manufacturing example 3 which is another embodiment of the invention.
Figure 4C:
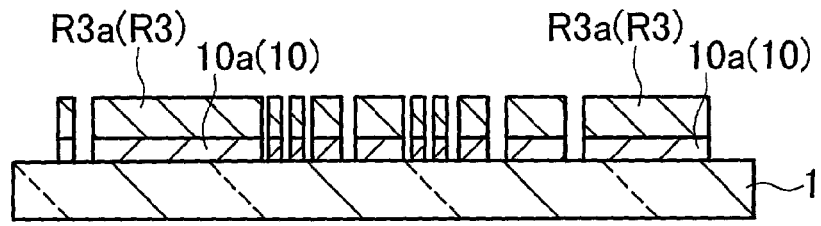
FIG. 4C is a cross-sectional view of an important part during manufacturing steps in a photomask manufacturing example 3 which is another embodiment of the invention.

The manufacturing example 3 for manufacturing the third mask M3 will be described with reference to FIGS. 4A to 4C showing cross-section views in the manufacturing steps. First, as shown in FIG. 4A, an i-line coating type photo absorptive organic anti-reflective film (to be simply referred to as "anti-reflective film" hereinafter) 10 and a resist R3 made of a novolac resin or the like are sequentially coated on an optical glass plate (blanks) 1. Next, as shown in FIG. 4B, exposure is performed by using a laser beam LA1 having a wavelength of 365 nm so as to form desired patterns. At this time, highly accurate exposure can be performed without influences on reflective light and thin film interference in the resist film since the anti-reflective film 10 is formed under the resist R3. Also, there arises no problem of charge-up which may occur by using an electron beam since the patterns are written with the laser beam LA1. Thereafter, as shown in FIG. 4C, development is performed with a TMAH solution to form resist patterns R3a and to process the anti-reflective film 10 and thereby form anti-reflective film patterns 10a. Since the anti-reflective film 10, for example, made of a polyimide resin soluble to the TMAH solution is employed, the film 10 is automatically processed in the development step. In addition, although the anti-reflective film 10 having an extinction factor of 0.33 with respect to i-line is employed herein, the film having higher extinction factor is preferable. This can enhance absorption of light and thereby thin the film thickness of the anti-reflective film 10. Therefore, the processing accuracy of the anti-reflective film 10 is improved. In this example, the film thickness of the anti-reflective film 10 is set at, for example, 0.35 μm. A positive resist, for example, is used as the resist R3. The film thickness of the resist R3 is set at, for example, 1.0 μm. Under these conditions, exposure light transmitting the resist R3 and the anti-reflective film 10 is 0.2%, and thus satisfactory shading effect can be obtained.

The mask M3 manufactured in this manufacturing example 3 can be formed through the coating, exposure, development and wet-etching of the organic film without the need to execute a sputtering step or a chromium film etching step using a vacuum apparatus at the time of widely coating a chromium film. Thus, the yield of manufacturing the mask M3 becomes high. In addition, since only the organic film is formed on the optical glass plate (blanks) 1 after use of the mask M3, it was possible to completely regenerate a state of the blanks by ashing or a solvent treatment. The mask M3 is, therefore, advantageous in the recycle of resources. Besides, in the case where manufacturing the mask M3 again is required, the mask M3 can be manufactured in a short time.

Although description has been given to the case of manufacturing the i-line mask in this example, it is also possible to manufacture a g-line mask by the same method.

In the latter case, it can be confirmed that the same advantage as the i-line mask is obtained.

[Mask Manufacturing Example 4]

A mask shown in the mask manufacturing example 4 will be named "mask M4" for the sake of convenience.

Figure 5:
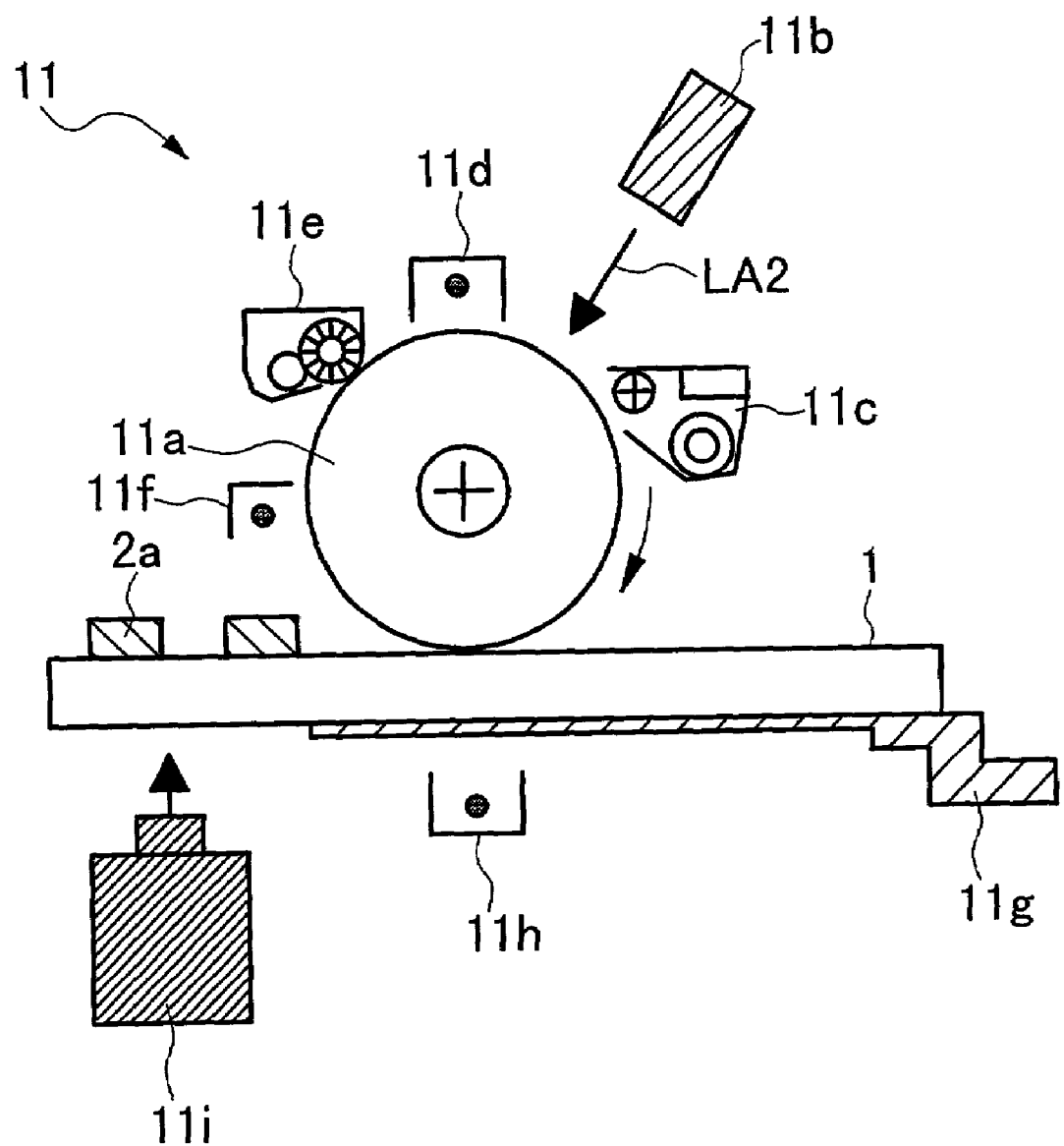
FIG. 5 is an explanatory view showing a manufacturing apparatus in a photomask manufacturing example 4 which is another embodiment of the present invention.

The configuration of a mask manufacturing apparatus used for manufacturing the mask M4 is shown in FIG. 5. Components of the mask manufacturing apparatus shown in FIG. 5 are as follows. That is, a reference symbol 11*a* denotes a rotating photo-conductor, 11*b* denotes a laser, 11*c* denotes a toner box, 11*d* denotes an electro static charger, 11*e* denotes a cleaner, 11*f* denotes AC corona, 1 denotes an optical glass plate, 11*g* denotes a handling arm, 11*h* denotes an electro static charger, 11*i* denotes an infrared lamp heater. In addition, reference symbol 2*a* shown on the optical glass plate 1 denotes a toner pattern functioning as a shade pattern. Also, reference symbol LA2 denotes a laser beam. Alternatively, a heat resisting optical plastic substrate may be used in place of the optical glass plate 1. The heat resisting optical plastic substrate has an advantage of inexpensiveness in price. On the other hand, the optical glass plate 1 has advantages in that the toner pattern 2*a* (that is, shade pattern (wiring pattern)) thus formed has a small positional distortion and the optical glass plate 1 can be recycled by ashing and regenerating the toner pattern 2*a* in an $O_2$ plasma atmosphere.

Figure 6A:
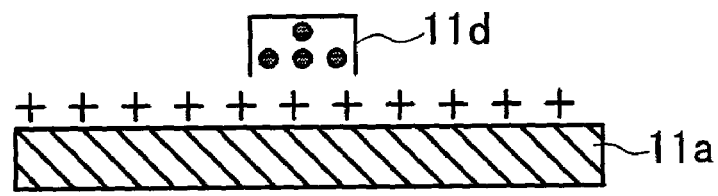
FIG. 6A is an explanatory view showing for manufacturing steps in a photomask manufacturing example 4 which is another embodiment of the present invention.
Figure 6B:
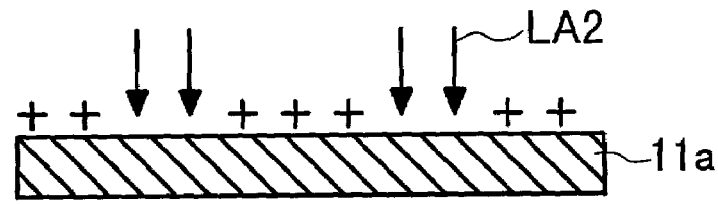
FIG. 6B is an explanatory view showing for manufacturing steps in a photomask manufacturing example 4 which is another embodiment of the present invention.
Figure 6C:
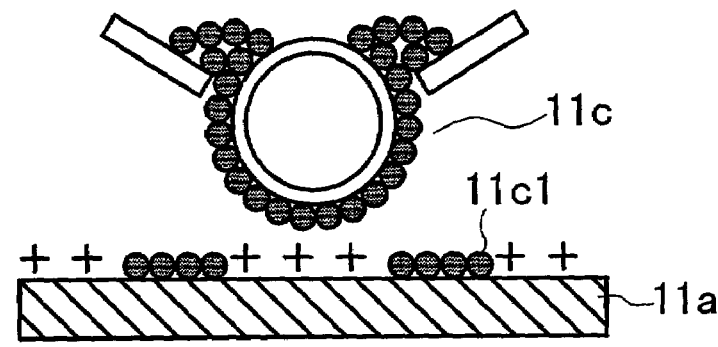
FIG. 6C is an explanatory view showing for manufacturing steps in a photomask manufacturing example 4 which is another embodiment of the present invention.

Next, the manufacturing steps of manufacturing the mask M4 will be described with reference to FIGS. 6A to 6E. First, as shown in FIG. 6A, the photo-conductor 11*a* is charged by using the electro static charger 11*d*. Thereafter, as shown in FIG. 6B, the surface of the photo-conductor 11*a* is illuminated with the laser beam LA2 emitted from the laser 11*b* to write a desired pattern. At this time, charges on portions illuminated with the laser disappear. Then, as shown in FIG. 6C, toner 11*c*1 from the toner box 11*c* is widely coated on uncharged portions in the surface of the photo-conductor 11*a*. The toner 11*c*1 contained black dye or black pigment (nano particles) such as carbon black, graphite or the like, and a thermo-softening resin (a binder) such as a novolac resin, polystyrene or the like. It is preferable that the content of this black dye or black pigment is 30% or more, and more preferably about 30 to 40%. It is noted that normally used toner has a black pigment or black die content of about 10%, which is inappropriate for a mask to obtain sufficient shading characteristic.

Figure 6D:
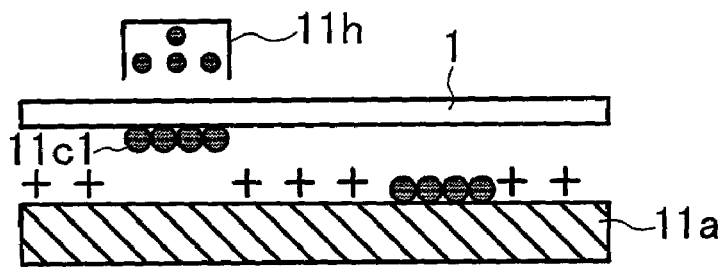
FIG. 6D is an explanatory view showing for manufacturing steps in a photomask manufacturing example 4 which is another embodiment of the present invention.
Figure 6E:
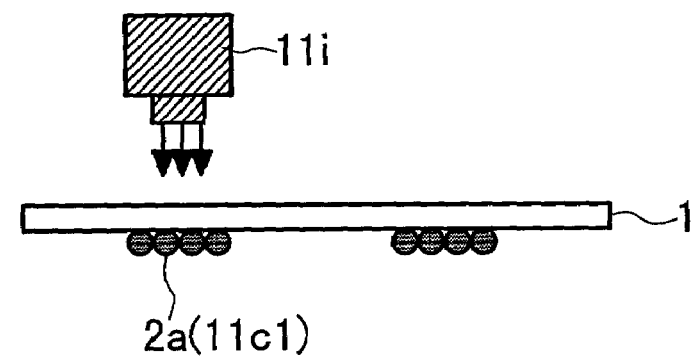
FIG. 6E is an explanatory view showing for manufacturing steps in a photomask manufacturing example 4 which is another embodiment of the present invention.

Thereafter, as shown in FIG. 6D, the optical glass plate 1 is brought into contact with or proximity to the photo-conductor 11*a*, and the toner 11*c*1 is moved onto the optical glass plate 1 by using the electro static charger 11*h* disposed on the rear surface of the optical glass plate 1. Finally, the toner 11*c*1 is heated and fixed to the plate 1 by the infrared lamp heater 11*i* to thereby form the toner pattern 2*a* consisting of the toner 11*c*1, on the optical glass plate 1. At this time, a press-fitting treatment may be carried out to accelerate a fixing operation.

In the mask M4 manufactured by the above-stated method, it is preferable that an area of the toner pattern 2*a* functioning as a shade band is gotten smaller than that of a region occupied by transmission of light. Namely, it is preferable that in the mask M4, a pattern corresponding to the wiring pattern of the wiring substrate is formed by the toner pattern 2*a* (i.e., negative pattern). By doing so, it is possible to make an uncharged area on the surface of the photo-conductor 11*a* smaller, and to thereby reduce defect-occurring portions of the toner pattern 2*a* which is formed by the toner and which is absorbed in the uncharged area. In other words, if the mask is formed by the above-stated method, it is considered that most of defects are formed on the shade pattern (i.e., toner pattern 2*a*). By making the shade pattern smaller, therefore, portions corresponding to defects thereof can be reduced. Further, the thickness of such a toner pattern 2*a* is not limited to a specific value, and may be, for example, 10 μm.

It is noted that the AC corona 11*f* and the cleaner 11*e* shown in FIG. 5 is employed to remove charges and toner on the photo-conductor 11*a*. In addition, the surface of the optical glass substrate 1 is preferably subjected to a surface treatment so as to make it easy to widely coat the toner.

The shade band (toner pattern 2*a*) of the mask M4 manufactured by the method shown in the manufacturing example 4 has a sufficient shading characteristic within a wavelength range of 250 to 600 nm. Further, time required to manufacture one mask M4 including development and fixing times is ten minutes or about one minute far shorter than them, and therefore this is eminently short in comparison with time required for manufacturing an ordinary mask using a metallic film as a shade band. In addition, because of dry development, preparing a special wet development device is not required, and thereby a line operation thereof is also eminently efficient. Also, since the cost of the manufacturing apparatus (electron beam writing device or the like) can be reduced and material cost, fuel cost, maintenance cost and/or the like can be reduced, it is possible to greatly reduce the manufacturing cost of the mask M4. Additionally, a large-sized manufacturing apparatus and a large-sized wet etching device are unnecessary in a mask manufacturing line, and thereby it is possible to simplify the mask manufacturing line and to reduce spaces for disposing these apparatus. Besides, even if the manufacturing example 4 is used, this does not adversely influence the environment.

In this example, description has been given of a method for forming a pattern by utilizing the electrostatic effect at the time of the manufacturing of the mask M4. Alternatively, the mask may be manufactured by an ink jet method for forming a shade pattern, by forming, in a beam shape, ink comprising black pigment or black dye which is nano particles such as carbon black, graphite or the like, and a binder composed of thermoplastic resin, and by spraying, with the ink, the optical glass plate 1 or the above-mentioned heat resisting optical plastic substrate. The ink jet method has particularly an advantage of reduction in the manufacturing cost, in addition to an effect obtained by the pattern formation method using the electrostatic effect stated above.

[Mask Manufacturing Example 5]

Figure 7:
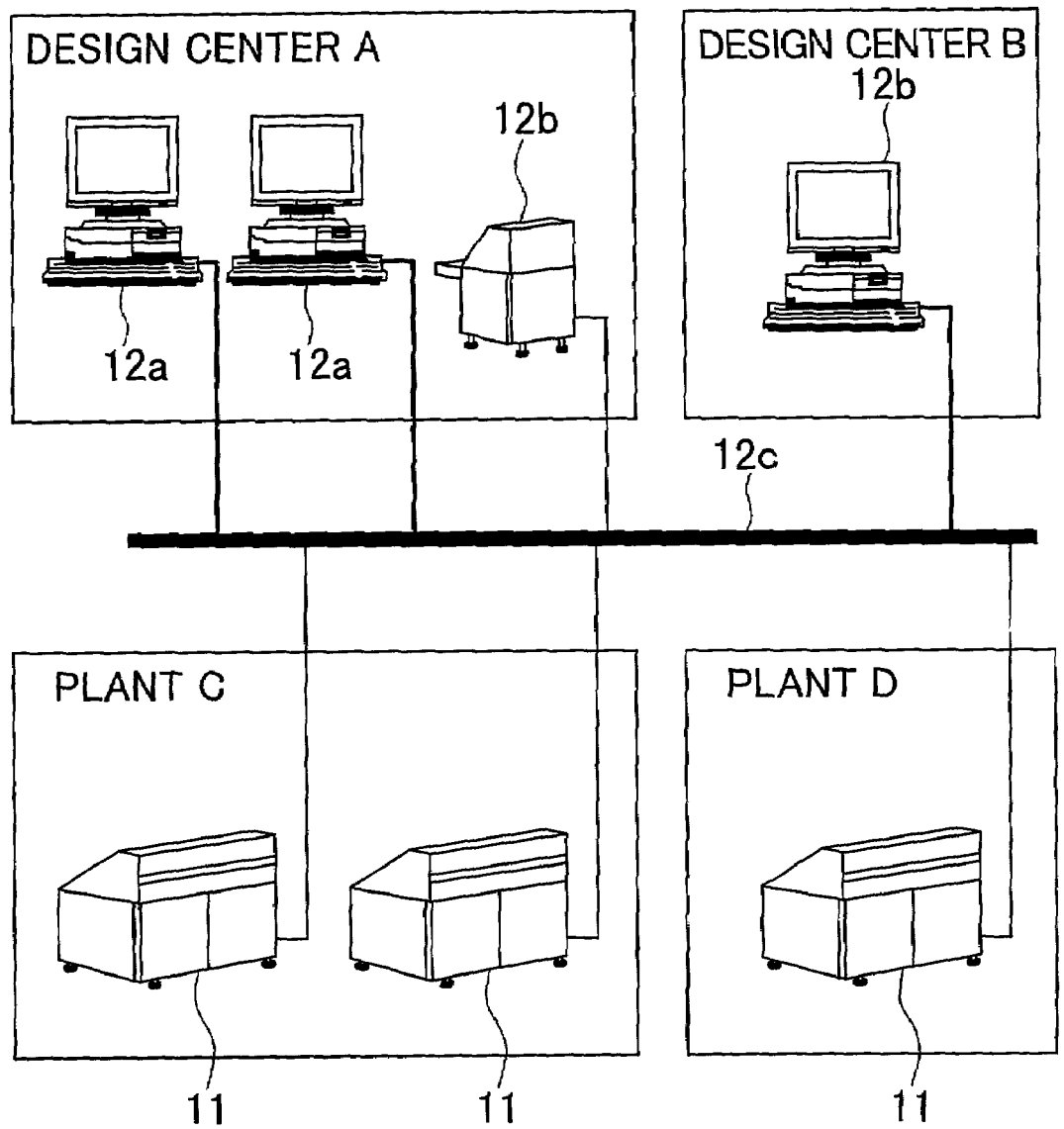
FIG. 7 is an explanatory view showing a manufacturing system for a photomask M4 which is another embodiment of the present invention.
Figure 8A:
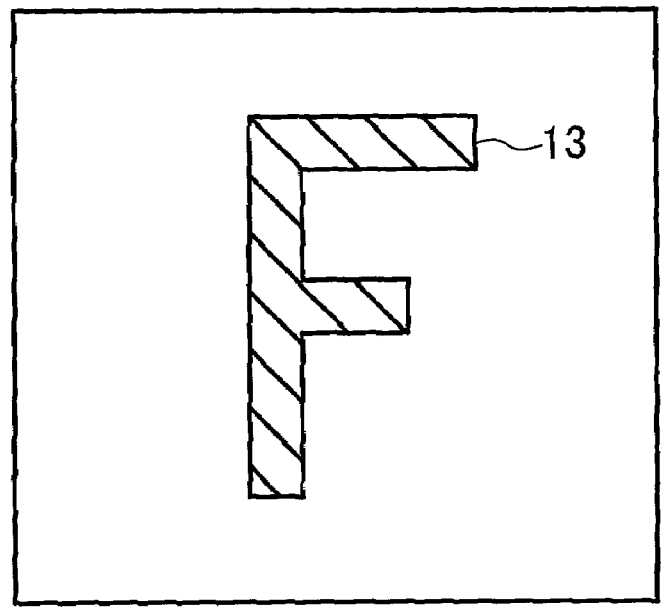
FIG. 8A is an explanatory view showing a pattern transfer state of a manufacturing apparatus employed for manufacturing the photomask M4.
Figure 8B:
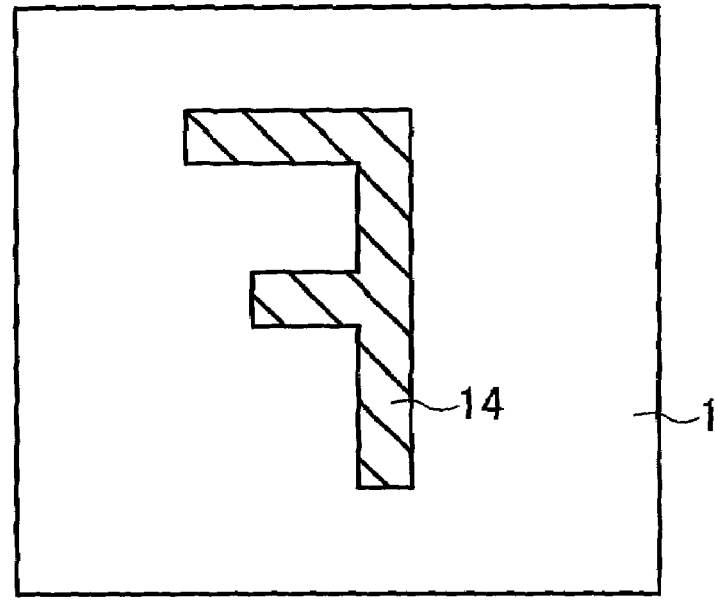
FIG. 8B is an explanatory view showing a pattern transfer state of a manufacturing apparatus employed for manufacturing the photomask M4.

In the mask manufacturing example 5, a manner of manufacturing the above-mentioned mask M4 will be described with reference to FIGS. 7, 8A and 8B.

First, in a design department, a wiring pattern such as wirings, through holes (via holes) and the like is laid out by using a design tool 12*a* such as a personal computer, a workstation or the like. The design department may be separated into a plurality of design centers A and B as shown in FIG. 7. The layout result can be printed by a print tool 12*b* such as a printer or the like. If necessary, the layout result may be printed out to check the layout. The design centers A and B are connected to each other and the design centers A and B are connected to mask plants C and D by a cable for information 12*c*. Layout information is transmitted from the design centers A and B to the mask plants C and D through the cable for information 12*c*. Also, if necessary, the design centers A and B exchange layout information for each other. Here, the cable for information 12*c* is not limited to a cable such as a wire or an optical cable or the like, and may also include wireless. A plurality of mask plants C and D may be provided. In each of the mask plants C and D, the above-mentioned mask manufacturing apparatus 11 for the manufacturing of the mask M4 are arranged, and the mask M4 is manufactured by each mask manufacturing apparatus 11 in the manner already stated above. Here, the layout pattern printed by the print tool 12b is an erected image pattern 13, for example, as shown in FIG. 8A whereas the layout pattern written on the mask M4 is a mirror inverse image 14 mirror-inverted from the erected image pattern as shown in FIG. 8B. That is, in printing, a normal pattern (pattern on mask design data) is data-inverted (mirror-inverted). Since this mask manufacturing system can connect a plurality of distant sites to one another and manufacture the mask, it is possible to shorten overhead time and to perform efficient operation in accordance with rate of operation thereof.

(First Embodiment)

Figure 9:
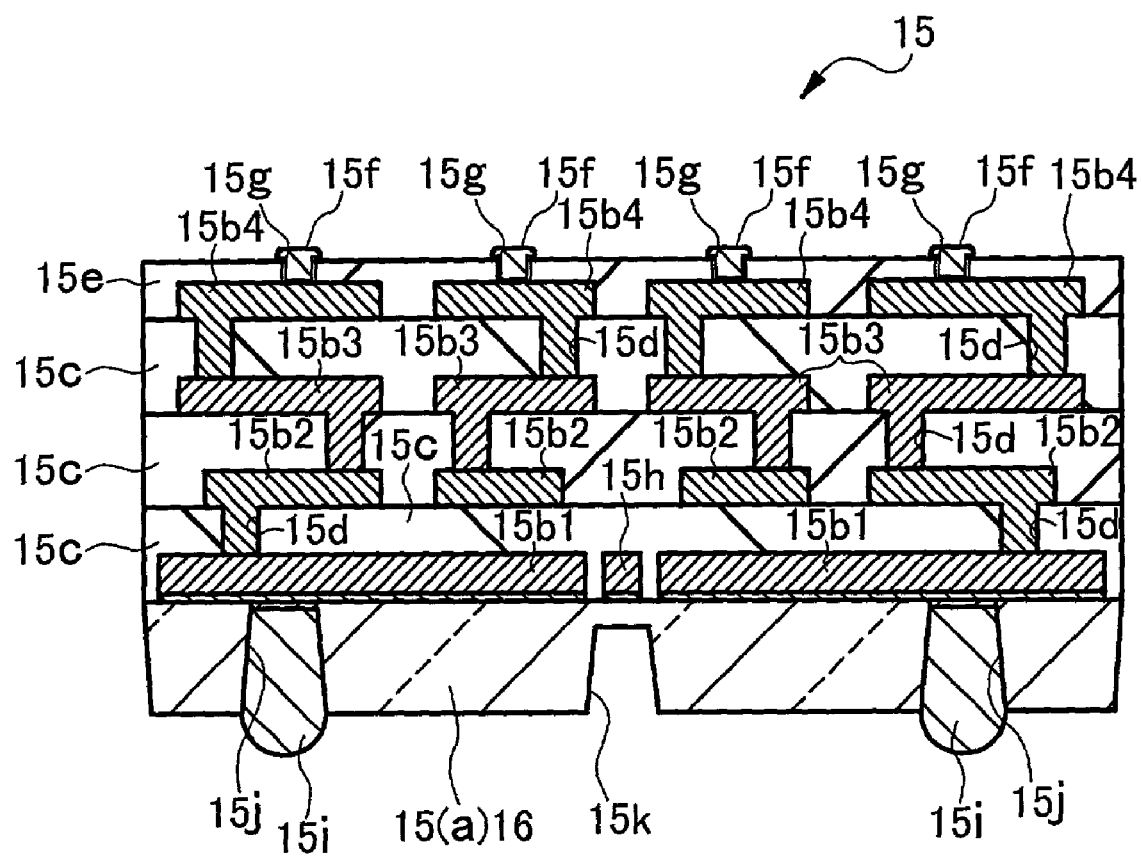
FIG. 9 is across-sectional view showing a wiring substrate that is one embodiment of the present invention.

FIG. 9 is a cross-sectional view showing one example of a wiring substrate 15 in this embodiment. This wiring substrate 15 is interposed between an electronic component such as a semiconductor chip (to be simply referred to as "chip" hereinafter) or the like and a printed wiring substrate. The wiring substrate 15 has a function of a connection substrate or a circuit substrate for electrically connecting a plurality of electronic components thereon to one another or for electrically connecting the electronic components to the printed wiring substrate. Further, since a large dimensional difference between each fine external terminal of the electronic components and each land of the printed wiring substrate prevents directly connecting both, a function of an interposer substrate or the like for dimensionally aligning each pattern of the electronic components to that of the printed wiring substrate. In this embodiment, wirings of the wiring substrate have line patterns and hole patterns such as through holes or via holes or the like used for electrically connecting different wiring layers to one another.

This wiring substrate 15 is constituted such that a plurality of wiring layers (line patterns) 15b1 to 15b4 are formed on a main surface (first surface) of a flat glass plate (substrate) 15a. Although description will be given of the case where four wiring layers are formed in this embodiment, the number of wiring layers formed on the glass plate 15a is not limited to four.

The glass plate 15a consists of no-alkali glass (composition: $SiO_2/B_2O_3/Al_2O_3/RO$ (alkali-earth metal oxide)=50 to 60/5 to 15/10 to 15/15 to 25 (wt %), distortion point: 600 to 700° C., and coefficient of thermal expansion: 3.5 to 5.0 ppm/K) used in a TFT liquid crystal substrate or the like, and the plate thickness of the glass plate 15a is about 0.5 mm.

Each of the wirings 15b1 to 15b4 consists of metal such as Al alloy, Cu, W (tungsten) or the like, and the wirings on an upper layer and the wirings on a lower layer are electrically connected to one another, via through holes 15d formed in an interlayer dielectric film 15c made of silicon oxide or the like. Also, the wirings 15b1 to 15b4 are formed so that each width of distances between the wirings becomes narrower as each layer of the wirings is remoter from the wiring substrate. For example, each width of and each distance between the wirings 15b1 disposed on the lowermost layer (first layer) are about 10 to 30 μm, respectively whereas each width of and each distance between the wirings 15b4 disposed on the uppermost layer (fourth layer) are about 1 to 10 μm, respectively.

A plurality of micro bumps (junction terminals) 15f are formed on an upper portion of an insulation film 15e covering the wirings 15b4 located on the uppermost layer. These micro bumps 15f are electrically connected to the wirings 15b4, via holes 15g formed in the insulation film 15e, respectively. Each micro bump 15f serves as a junction terminal when each electronic component is mounted over the wiring substrate 15, and consists of an Au bump or an Sn bump or the like having a diameter of, for example, about 5 to 100 μm.

At the time of mounting each electronic component over the wiring substrate 15, alignment is performed by using, as a reference, an alignment mark 15h formed on the main surface of the glass plate 15a. The alignment mark 15h is composed of a wiring material, and is formed simultaneously with, for example, the step of forming the wirings 15b1 on the first layer. Above the alignment mark 15h, the wirings 15b1 to 15b4 are not arranged on the upper layers so that the alignment mark 15h and each electronic component can be simultaneously and visually recognized from a rear surface (lower surface) side of the glass plate 15a.

On a rear surface (lower surface) of the glass plate 15a, i.e., on a surface opposite to each surface on which the wirings 15b1 to 15b4 and the micro bumps 15f are formed, a plurality of bump electrodes (external junction terminals) 15i constituting external junction terminals of the wiring substrate 15 are formed, respectively. These bump electrodes 15i are electrically connected to the wirings 15b1, through the via holes 15j formed in the glass plate 15a, respectively. Each of the bump electrodes 15i is composed of a solder or the like having a lower melting point than the micro bump 15f, and the diameter of each bump electrode 15i is larger than that of the micro bump 15f, e.g., about several hundred micrometers.

Also, a hole 15k is formed in the rear surface of the glass plate 15a in order to facilitate visual recognition of the alignment mark 15h formed on the main surface of the glass plate 15a. This hole 15k is formed simultaneously with the step of forming the vial holes 15j in the glass plate 15a.

As can be seen, the wiring substrate 15 in this embodiment is constituted such that both the wirings 15b1 to 15b4 provided on a plurality of layers and a plurality of micro bumps 15f are formed on the main surface of the glass plate 15a, a plurality of bump electrodes 15i serving as external junction terminals are formed on the rear surface of the glass plate 15a, and the wirings 15b1 to 15b4 are electrically connected to the bump electrodes 15i, through the via holes 15j formed in the glass plate 15a, respectively.

Next, a concrete example of a method for manufacturing the wiring substrate 15 constituted as stated above will be described with reference to FIGS. 10A to 18.

Figure 10A:
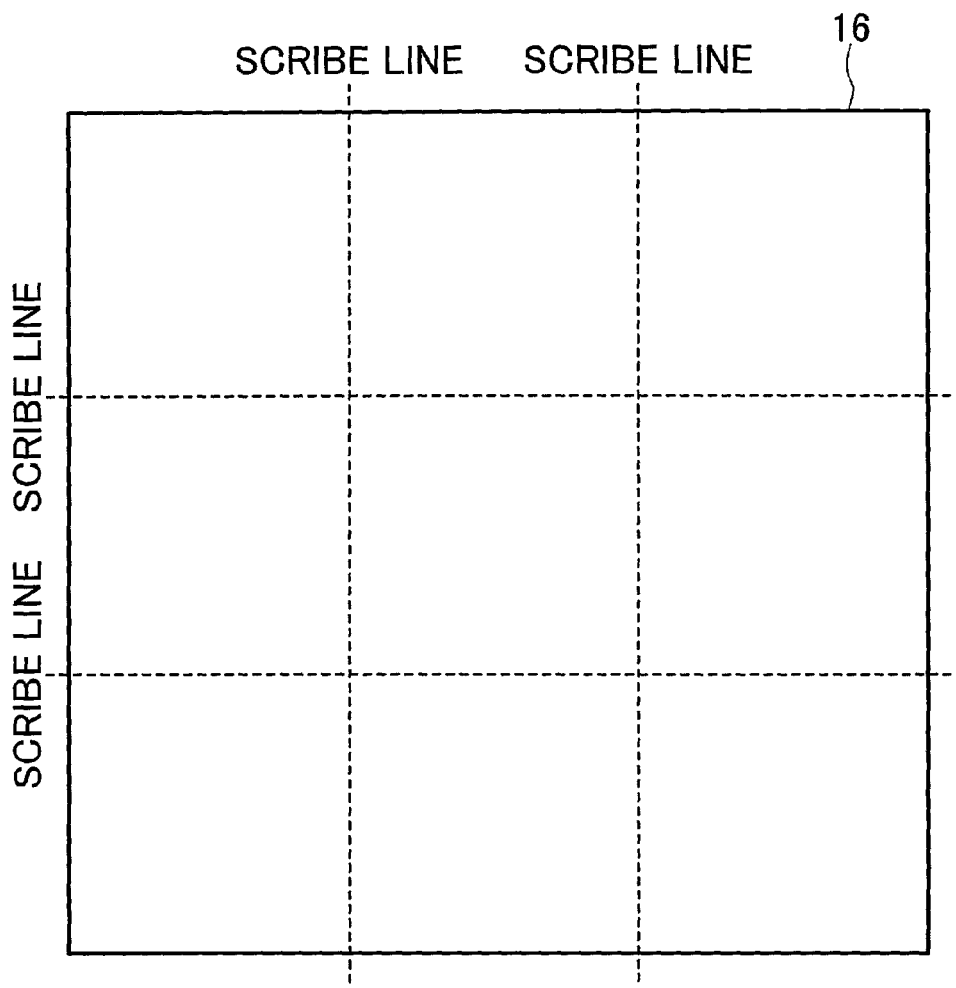
FIG. 10A is an overall plan view showing a substrate employed in the manufacturing steps of manufacturing the wiring substrate shown in FIG. 9.
Figure 10B:
FIG. 10B is a cross-sectional view of FIG. 10A.

To manufacture the wiring substrate 15, a glass plate 16 having a large area as shown in FIGS. 10A and 10B is employed. On this glass plate 16, each area partitioned by scribe lines indicated by broken lines corresponds to one glass plate 15a. By dicing the glass plate 16 along the scribe lines at the final stage of manufacturing steps to be described later, many wiring substrates 15 can be obtained simultaneously. The glass plate 16 may be of a disk shape similar to a shape of a silicon wafer. In that case, the wiring substrate 15 can be manufactured by using a silicon wafer manufacturing line.

The glass plate 16 is made of no-alkali glass having the above-stated composition. Since no-alkali glass is small in warpage and change of dimension, it is possible to form the fine wirings 15b1 to 15b4, through holes 15d, micro bumps 15f and the like with high dimensional accuracy by using the photolithographic technique. Further, since no-alkali glass is less expensive than silicon, it is possible to reduce the manufacturing cost of the wiring substrate in comparison with a wiring substrate using a silicon substrate.

The material of the glass plate 16 is not limited to no-alkali glass, and may be borosilicate glass normally employed in a transparent glass portion such as a semiconductor sensor or the like. Borosilicate glass contains a few wt % of alkali components (while no-alkali glass contains an alkali component of 0.1 wt % or less). However, since borosilicate glass is as small in warpage and change of dimension as no-alkali glass, it is suitable for forming fine patterns. Also, since the cost price of borosilicate glass is about ⅓ to ⅕ of that of no-alkali glass, it is possible to further reduce the manufacturing cost of the wiring substrate 15.

Alternatively, quartz glass can be employed as a glass material which is small in warpage and change of dimension and which contains no alkali components.

Alkali components contained in glass is easily deposited on the surface of the glass. Due to this, the alkali concentration of the surface tends to be higher with the passage of time. As a counterplan thereof, the alkali components can be effectively barriered by coating a silicon nitride film on the surface of the glass by an evaporation method or the like. As a substrate made of a material other than glass, an Si substrate widely coated with an insulation film, a ceramic substrate made of AlN or SiC or the like, or an glass fiber-containing epoxy resin (glass epoxy) substrate or a polyimide resin substrate may be used. The Si substrate is easy to process, and the resin substrate is inexpensive. In the case where the resin substrate is employed as the wiring substrate 15, however, it is preferable to provide a mechanism for correcting a warp caused in exposure by stage adhesion.

Figure 11A:
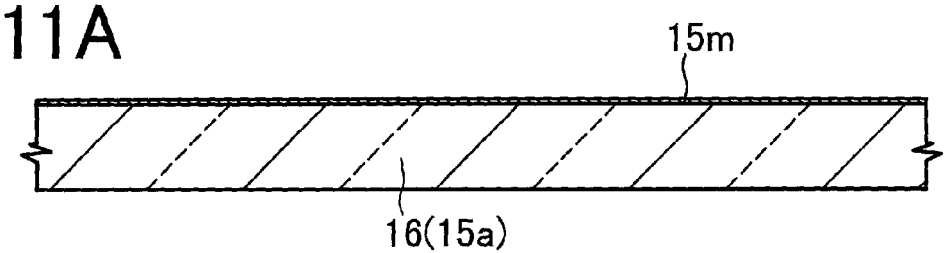
FIG. 11A is a cross-sectional view showing a wiring substrate shown in FIG. 9 during manufacturing steps.

To manufacture the wiring substrate 15 by using the above-stated glass plate 16, first, a bonding layer 15m is formed on the main surface of the glass plate 16 so as to enhance a bonding force between the glass and the wiring material, as shown in FIG. 11A. The bonding layer 15m is composed of, for example, a TiN (titanium nitride) film, a TiW (titanium tungsten) film or the like deposited by a sputtering method.

Figure 11B:
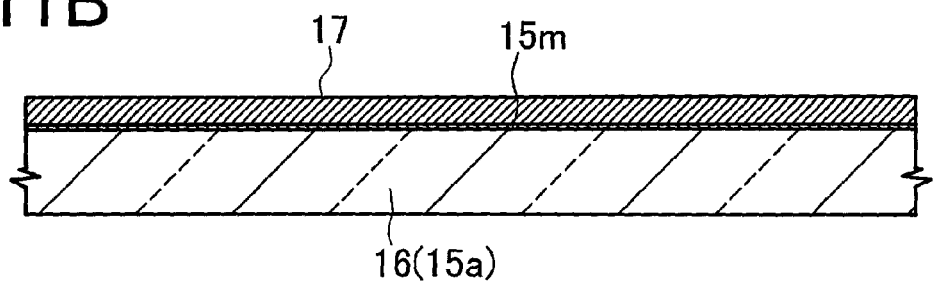
FIG. 11B is a cross-sectional view showing a wiring substrate shown in FIG. 9 during manufacturing steps.
Figure 11C:
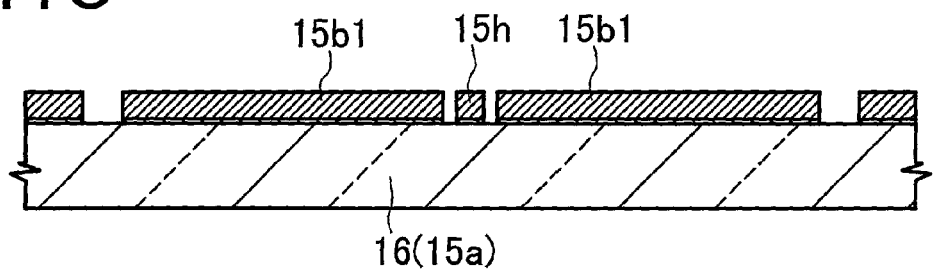
FIG. 11C is a cross-sectional view showing a wiring substrate shown in FIG. 9 during manufacturing steps.

Next, as shown in FIG. 11B, a metallic film 17 made of Al alloy or the like is deposited on the bonding layer 15m by a sputtering method. Thereafter, as shown in FIG. 11C, by using the mask M1 stated above, a photoresist film (not shown) deposited on the glass plate 16 is exposed and developed to form a photoresist pattern (not shown), and the metallic film 17 is patterned by dry etching, and thereby the wirings 15b1 are formed on the first layer. Simultaneously with the formation of the wirings 15b1, the alignment mark 15h is formed.

Figure 11D:
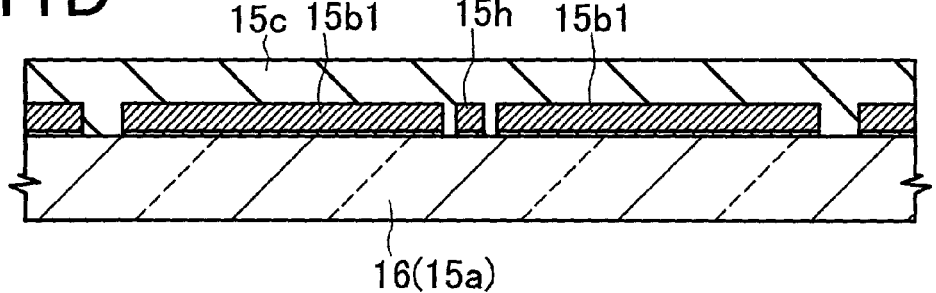
FIG. 11D is a cross-sectional view showing a wiring substrate shown in FIG. 9 during manufacturing steps.
Figure 11E:
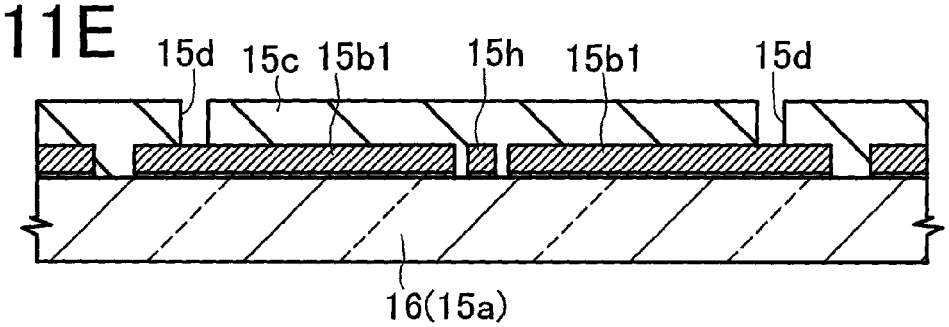
FIG. 11E is a cross-sectional view showing a wiring substrate shown in FIG. 9 during manufacturing steps.

Next, as shown in FIG. 11D, the interlayer dielectric film 15c is formed on the wirings 15b1 located on the first layer. Then, as shown in FIG. 11E, by using the mask M1 stated above, a photoresist film (not shown) deposited on the glass plate 16 is exposed and developed to form a photoresist pattern (not shown), and the interlayer dielectric film 15c is subjected to dry etching, and thereby the through holes 15d are formed in the interlayer dielectric film 15c located on the wirings 15b1. The interlayer dielectric film 15c is composed of a silicon oxide film deposited by a CVD method or the like, or a polyimide film deposited by a coating method, or the like. In this embodiment, i-line (wavelength of 365 nm) emitted from an extra-high pressure mercury lamp is employed as exposure light of the photoresist pattern. Alternatively, g-line (wavelength of 436 nm) or h-line (wavelength of 405 nm) may be employed, or broadband light containing these lines may be employed. It is noted, however, it is preferable to employ, as exposure light, light having a long wavelength exceeding 350 nm in view of holding down the cost of the optical glass plate (mask blanks). This is because if the wavelength thereof is 350 nm or less, expensive glass such as quartz glass is required. It is preferable to employ normal LE glass to hold down the cost of mask. In the case of dealing with a wiring pattern having a pattern size larger than, for example, 20 μm, the dimensional accuracy and positional accuracy thereof on a mask become lower. In that case, the optical glass plate (mask blanks) made of plastic such as polycarbonate may be employed. If so, it is possible to particularly reduce the cost of blanks. Further, since the lamp is lower in apparatus cost and running cost than a gas laser light source such as an ArF excimer laser, it is a preferable light source. Although it is possible to technically utilize the lithography with an ArF excimer laser used as a light source, this does not satisfy cost requirements for manufacturing the wiring substrate having the minimum wiring size of 1 μm. Accordingly, in case of a mask using a resist as a shade as described in Japanese Patent Laid-Open No. 5-289307 which has proposed a lower cost mask than an ordinary mask using chromium (Cr) as a shade band, it is necessary to use, as exposure light, vacuum ultraviolet light, i.e., light having a wavelength of 200 nm or less in view of a shading rate. Consequently, this method is not suitable for manufacturing a wiring substrate.

Figure 12:
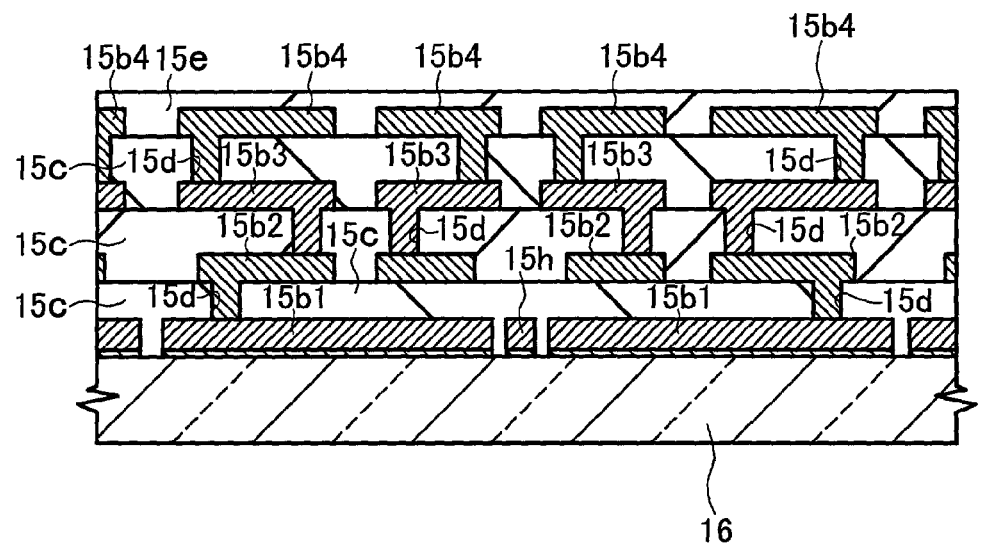
FIG. 12 is a cross-sectional view during a manufacturing step of the wiring substrate shown in FIG. 9 following the wiring substrate shown in FIGS. 11A to 11E.

Next, as shown in FIG. 12, after formation of the wirings 15b2 to 15b4 to be located on the second to fourth layers by repeating the steps shown in FIGS. 11B to 11E a plurality of times, the insulation film 15e is formed on the wirings 15b4. The insulation film 15e is composed of a silicon oxide film deposited by a CVD method or the like, or a silicon nitride film, or a polyimide film deposited by a coating method, or the like.

Figure 13:
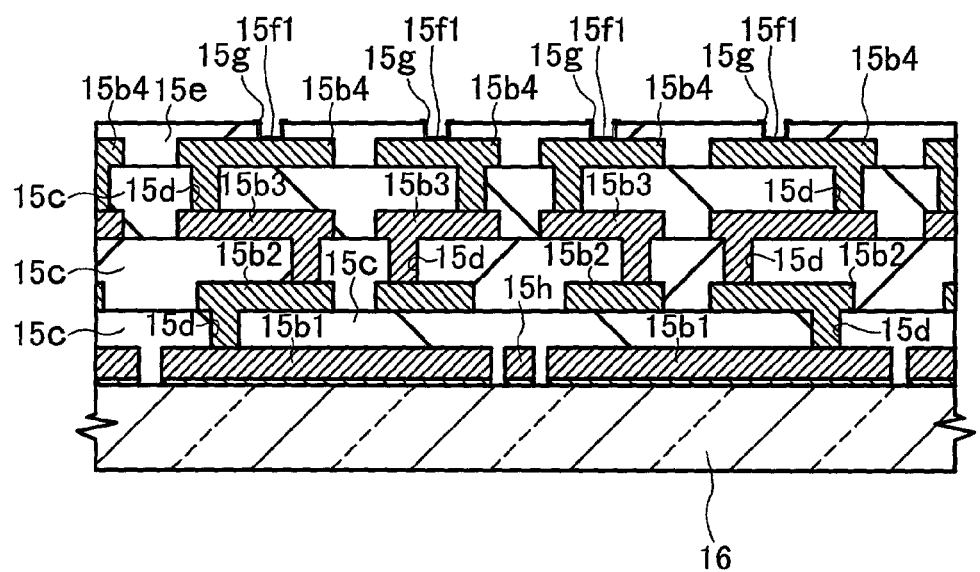
FIG. 13 is a cross-sectional view showing the wiring substrate shown in FIG. 9 during manufacturing steps following the manufacturing steps shown in FIG. 12.

Next, as shown in FIG. 13, by using the above-stated mask M1, a photoresist film (not shown) deposited over the glass plate 16 is exposed and developed to form a photoresist pattern (not shown), and the insulation film 15e is subjected to dry etching and thereby holes 15g are formed in the insulation film 15e located on the wirings 15b4, and then barrier metal layers 15f1 are formed inside the respective holes 15g. Each of the barrier metal layers 15f1 is formed by, for example, depositing a Cr film and a Cu film on the insulation film 15e including the interior of each hole 15g by an evaporation method or the like, exposing and developing a photoresist film (not shown) deposited on the glass plate 16 by using the above-stated mask M1 to form a photoresist pattern (not shown), and removing the unnecessary Cr film and Cu film on the insulation film 15e by dry etching.

Figure 14:
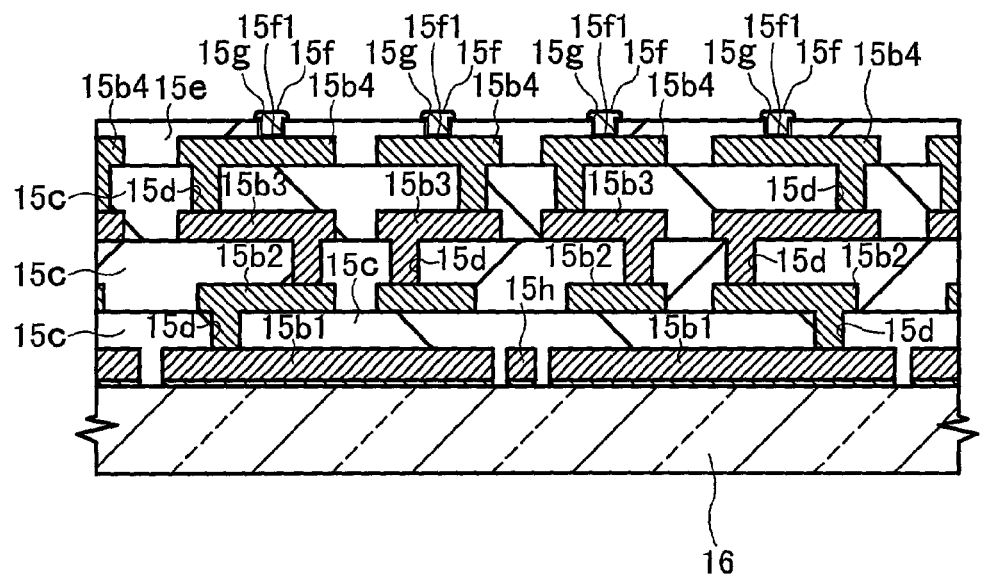
FIG. 14 is a cross-sectional view showing the wiring substrate shown in FIG. 9 during manufacturing steps following the manufacturing steps shown in FIG. 13.

Next, as shown in FIG. 14, micro bumps 15f are formed in the interiors of the respective holes 15g. Each of the micro bumps 15f is formed by, for example, depositing an Au film or an Sn film on the insulation film 15e including the interior of each hole 15g by an evaporation method, exposing and developing a photoresist film (not shown) deposited on the glass plate 16 by using the above-stated mask M1 to form a photoresist pattern (not shown), and removing the unnecessary Au film or Sn film on the insulation film 15e by dry etching.

The wirings 15b1 to 15b4 may be formed of a W film deposited by a sputtering method or the like, or a Cu film formed by a plating method. In the case of employing, as a wiring material, the Cu film formed by a plating method, the bonding layer 15m formed between the glass plate 16 and the wirings 15b1 is composed of, for example, a TiN (titanium nitride) film or a Cr film deposited by a sputtering method. The wirings located on an upper layer and those located on a lower layer may be formed of different metallic materials.

Figure 15:
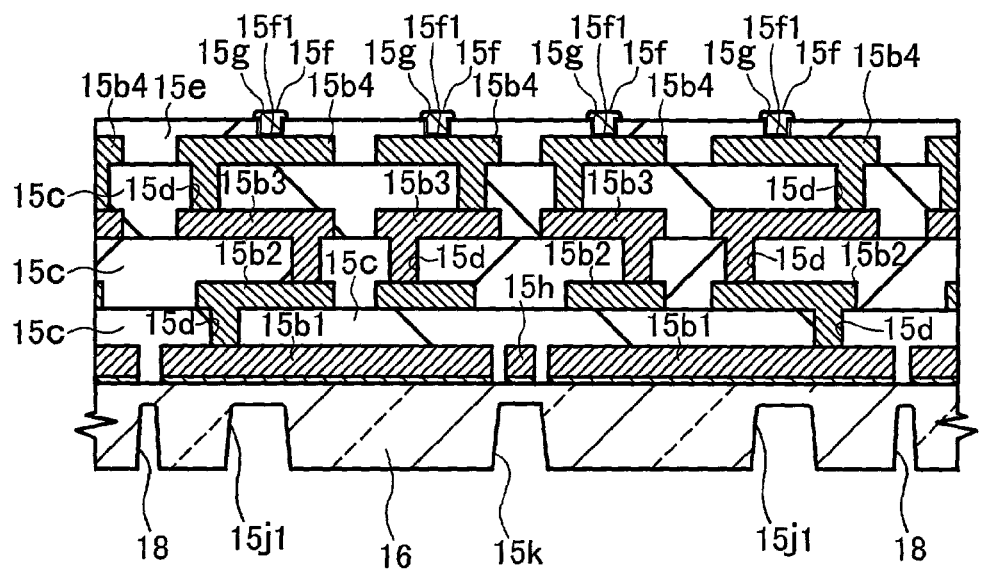
FIG. 15 is a cross-sectional view showing the wiring substrate shown in FIG. 9 during manufacturing steps following the manufacturing steps shown in FIG. 14.

Next, as shown in FIG. 15, the rear surface (lower surface: surface facing a mounting substrate such as a printed wiring substrate) of the glass plate 16 is wet-etched up to as much as about half the thickness of the plate 16 by using an etchant containing a hydrofluoric acid, and thereby the holes 15j1 is formed in areas to which the respective bump electrodes 15i is connected in a later step. Also, at the same time, the hole 15k is formed right under the alignment mark 15h, and scribe guides 18 are formed in scribe areas. When the rear surface of the glass plate 16 is subjected to wet etching, the rear surface of the glass plate 16 is covered with a photoresist film or the like, except the areas in which the holes 15j1 and 15k and the scribe guides 18 are formed. In addition, the main surface (surface on which the electronic components are mounted) of the glass plate 16 on which the micro bumps 15f and the wirings 15b1 to 15b4 are formed is also covered with a resist film, a cover ray film, a UV film which is peeled off by illumination of ultraviolet light, or the like.

Figure 16:
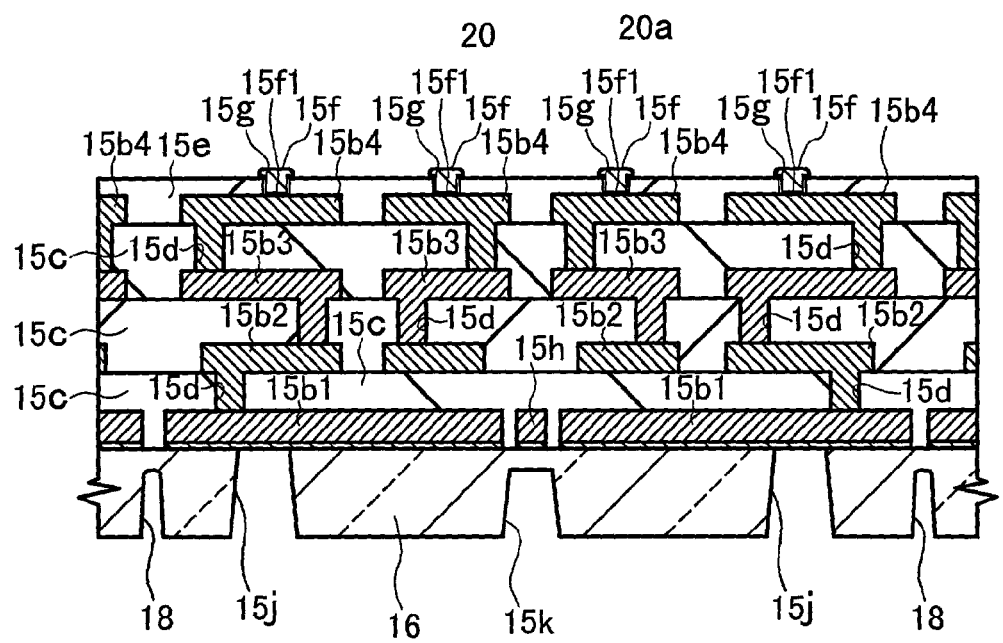
FIG. 16 is a cross-sectional view showing the wiring substrate shown in FIG. 9 during manufacturing steps following the manufacturing steps shown in FIG. 15.

Next, as shown in FIG. 16, the holes 15j1 are further wet-etched, and thereby the via holes 15j reaching the wirings 15b1 are formed, respectively. When this wet etching is performed, the rear surface of the glass plate 16 is covered with a photoresist film or the like, except the areas for forming the via holes 15j. The main surface of the glass plate 16 is also covered with a resist film, a cover ray film, a UV film or the like.

Figure 17:
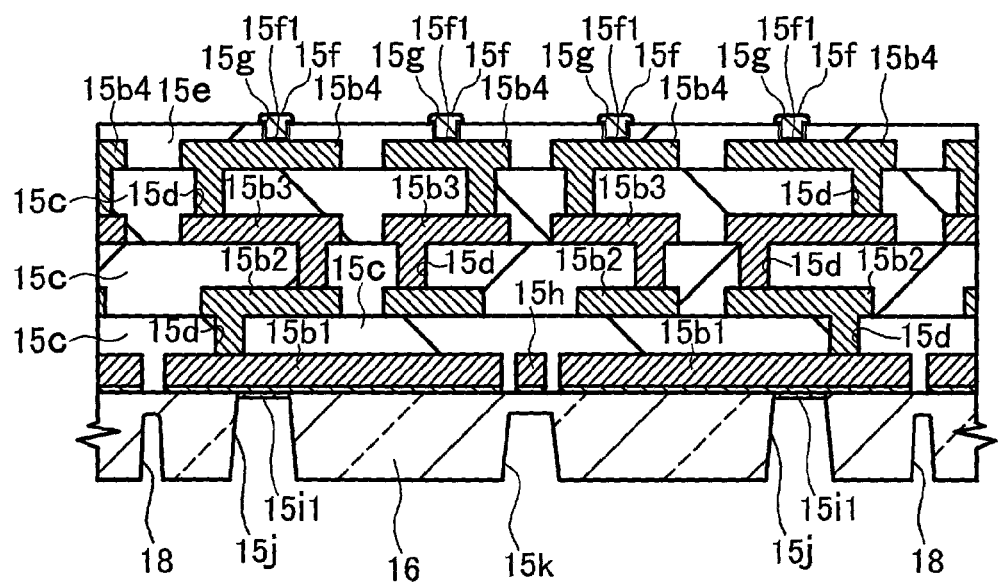
FIG. 17 is a cross-sectional view showing the wiring substrate shown in FIG. 9 during manufacturing steps following the manufacturing steps shown in FIG. 16.
Figure 18:
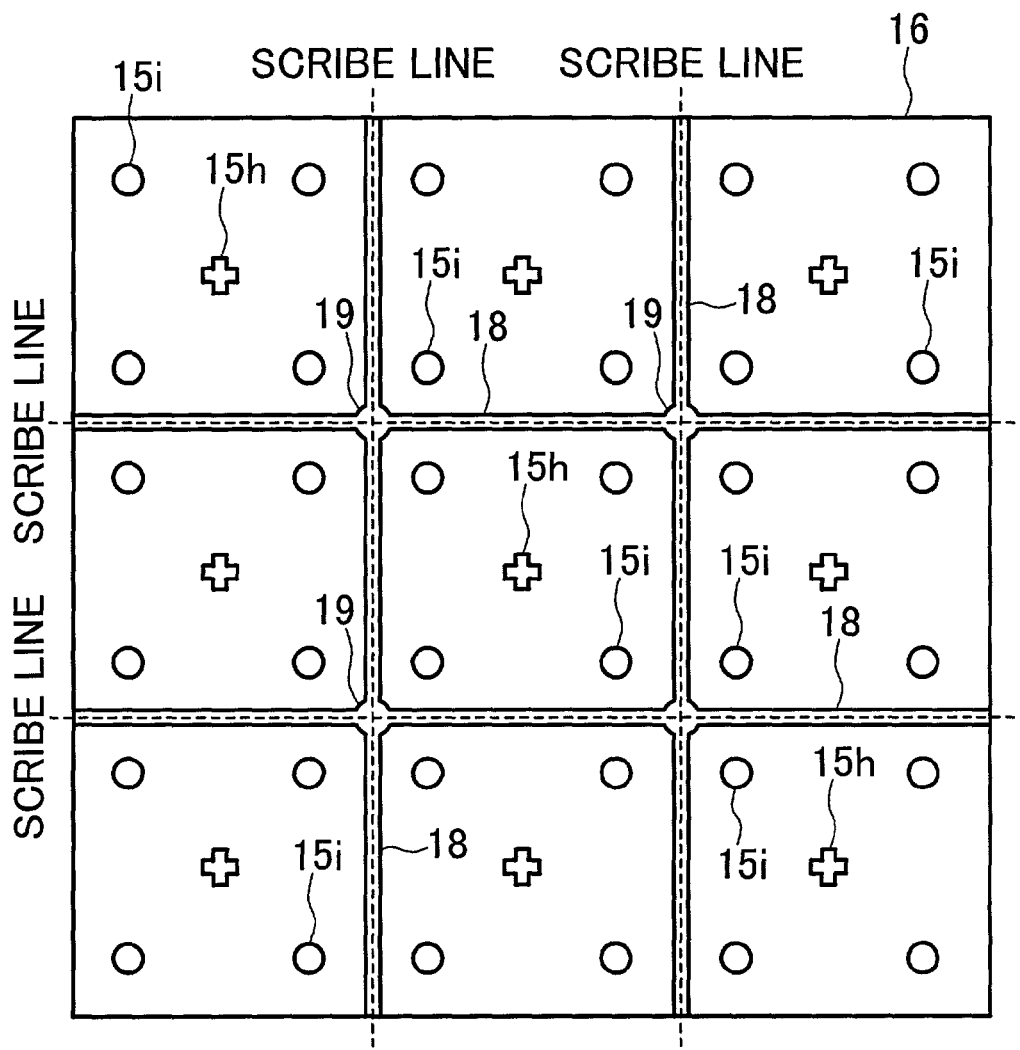
FIG. 18 is a plan view showing the wiring substrate shown in FIG. 9 during manufacturing steps following the manufacturing steps shown in FIG. 17.

Next, as shown in FIG. 17, a barrier metal 15i1 is formed on each bottom of the via holes 15j. Thereafter, as shown in FIG. 18, the bump electrodes 15i are formed inside the respective via holes 15j. Each of the barrier metals 15i1 is formed by, for example, depositing a Cr film, a Cu film and an Au film on the rear surface of the glass plate 16 and inside the via holes 15j by an evaporation method, exposing and developing a photoresist film (not shown) deposited on the glass plate 16 using the above-stated mask M1 to form a photoresist pattern (not shown), and removing the unnecessary Cr film, Cu film and Au film by dry etching. Each barrier metal 15i1 may be formed to cover the overall inner wall of each via hole 15j.

Each of the bump electrodes 15i is formed by supplying an eutectic solder (Pb37/Sn63: 183° C.), a low temperature solder (Sn17/Bi57/In26: 78.9° C.) or the like having a lower melting point than each micro bump 15f, to the interior of each via hole 15j by a solder ball supply method or a screen print method, and then subjecting this solder to reflow. Each shape of the bump electrodes 15i is not limited to a ball shape and may be a land shape.

Thereafter, by dicing the glass plate 16 along the scribe lines shown in FIG. 18, the wiring substrate 15 shown in FIG. 9 is obtained. Since the above-mentioned scribe guides 18 are formed in the scribe line in advance, it is possible to easily perform dicing and to prevent the glass plate 16 from being broken or burred during the dicing. Further, by forming round holes 19 or the like larger in diameter than the scribe guides 18 at intersection points of the scribe lines, it is possible to dice the glass plate 16 more easily. These round holes 19 can be simultaneously formed with the formation of the scribe guides 18 by wet-etching the intersection points of the scribe lines in the step of forming the scribe guides 18.

The rear surface of the glass plate 16 may be processed by a combination of dry etching and wet etching. In this case, first, dry etching is performed by using the photoresist film as a mask to form shallow grooves in the glass plate 16. Next, by using this photoresist film as a mask, wet etching is performed to further etch the glass plate 16. This method is lower in throughput than wet etching. But since forming the shallow grooves by highly anisotropic dry etching and thereafter wet-etches each glass inside the grooves, this method can form the via holes 15j, the hole 15k and the scribe guides 18 with fine dimension.

The rear surface of the glass plate 16 may be also processed by using a laser method. Carbon dioxide laser (wavelength: about 10.6 μm) absorbed by glass is employed as a laser light source. Further, the rear surface of the glass plate 16 may be processed by using a sand blasting method for spraying the glass plate with abrasives such as alumina or the like at high pressure.

The processing of the main surface of the glass plate 16 (formation of the wirings 15b1 to 15b4 and the micro bumps 15f) and the processing of the rear surface thereof (formation of the via holes 15j, the hole 15k and the scribe guides 18, and connection of the bump electrodes 15i) may be carried out in a different order from the above-stated order. For example, after formation of the via holes 15j, the hole 15k and the scribe guides 18 on the rear surface of the glass plate 16 and then formation of the wirings 15b1 to 15b4 and the micro bumps 15f on the main surface of the glass plate 16, the bump electrodes 15i may be connected into the via holes 15j. Alternatively, after formation of the holes 15j1 and 15K and the scribe guides 18 on the rear surface of the glass plate 16 and then formation of the wirings 15b1 to 15b4 and the micro bumps 15f on the main surface of the glass plate 16, the holes 15j1 may be etched to form the via holes 15j and thereby the bump electrodes 15i may be connected into the via holes 15j.

In this embodiment, the above-stated mask M1 is used in an exposure treatment for forming the wirings. However, it is also possible to use the above-stated masks M2, M3 and M4 instead of the mask M1. These masks may be used properly according to the steps. Each of the masks M1 to M4 has an advantage of shorter mask manufacturing time than an ordinary mask using chromium as a shade band, and an advantage of lower cost. Also, each of the masks M1 to M4 has an advantage of being cable of peeling off a shading substance by ashing in a plasma atmosphere. If the mask blanks (optical glass plate 1) are made of quartz glass or the other optical glass, the mask blanks can be recycled by ashing. Ashing and regenerating of the used masks have effects on reduction in the cost and on recycling. The mask M1 having the shade band consisting of nano particles and a binder has a high exposure light illumination-resistant characteristic and so can be kept durable for a long time. The mask M2 having the shade band consisting of a resist to which light absorber is added can be manufactured by using the same writing device, coating device and development device as those used for manufacturing an ordinary mask having chromium or the like used as a shade band, and has high pattern-arrangement accuracy. Since time required for regenerating the mask M2 by ashing is short, the mask M2 is suitable for recycling mask blanks. The mask M3 having a shade band consisting of a photo absorptive organic film and a resist has an effect on reflective prevention at the time of pattern writing with a laser, and the resist film thickness of the mask M3 can be made comparatively thin. Due to this, the mask M3 is suitable for forming fine patterns. The mask M4 which has the shade band consisting of toner and which is manufactured by dry development has advantages in that mask manufacturing time thereof is shorter than that of the other masks M1, M2 and M3, and a special apparatus for a wet development is not required, and the mask M4 is inexpensive. On the other hand, the mask M4 has no higher pattern fine property than pattern fine properties of the masks M1, M2 and m3. Therefore, the mask M4 is, preferably, suitable for forming wiring patterns on lower layers which do not require fine wiring pattern dimension, i.e., on the first and second layers which are disposed in a side of the printed wiring substrate and whose each dimensional accuracy is comparatively rough.

In this way, this embodiment can form the fine wirings 15$b$1 to 15$b$4, through holes 15$d$ and the like over the glass plate 15$a$ by a photolithographic technique using masks which are short in manufacturing TAT and low in cost. This embodiment can, therefore, manufacture the wiring substrate 15 capable of mounting electronic components with high density in short TAT and at low cost. As described in this embodiment, particularly since the manufacture of the wiring substrate 15 requires to prepare many masks per type, cost reduction in the masks and shortage of manufacturing TAT greatly affect shortage of TAT of and cost reduction in the wiring substrate 15. The wiring substrate manufactured in this embodiment can be therefore used as a wiring substrate constituting a small quantity of various kinds of semiconductor devices.

Furthermore, according to this embodiment, the bump electrodes 15$i$ serving as external junction terminals are arranged on the rear surface of the glass plate 15$a$, and the wirings 15$b$1 to 15$b$4 and the bump electrodes 15$i$ are electrically connected through the via holes 15$j$ formed in the glass substrate 15$a$, respectively. By doing so, it is possible to ensure a wide mounting region of the electronic components, and thereby to mount the electronic components with higher density.

On the wiring substrate 15 according to this embodiment, various types of electronic components can be mounted, including an image pick-up device such as a silicon chip on which active elements and/or integrated circuits are formed, or a CCD (Charge Coupled Device) or the like, and a passive element such as a chip capacitor or the like can be mounted. To mount these electronic components, micro bumps may be formed in a side of the electronic components to connect the micro bumps 15$f$ of the wiring substrate 15 and the micro bumps formed in the electronic component side, to one another.

Figure 19:
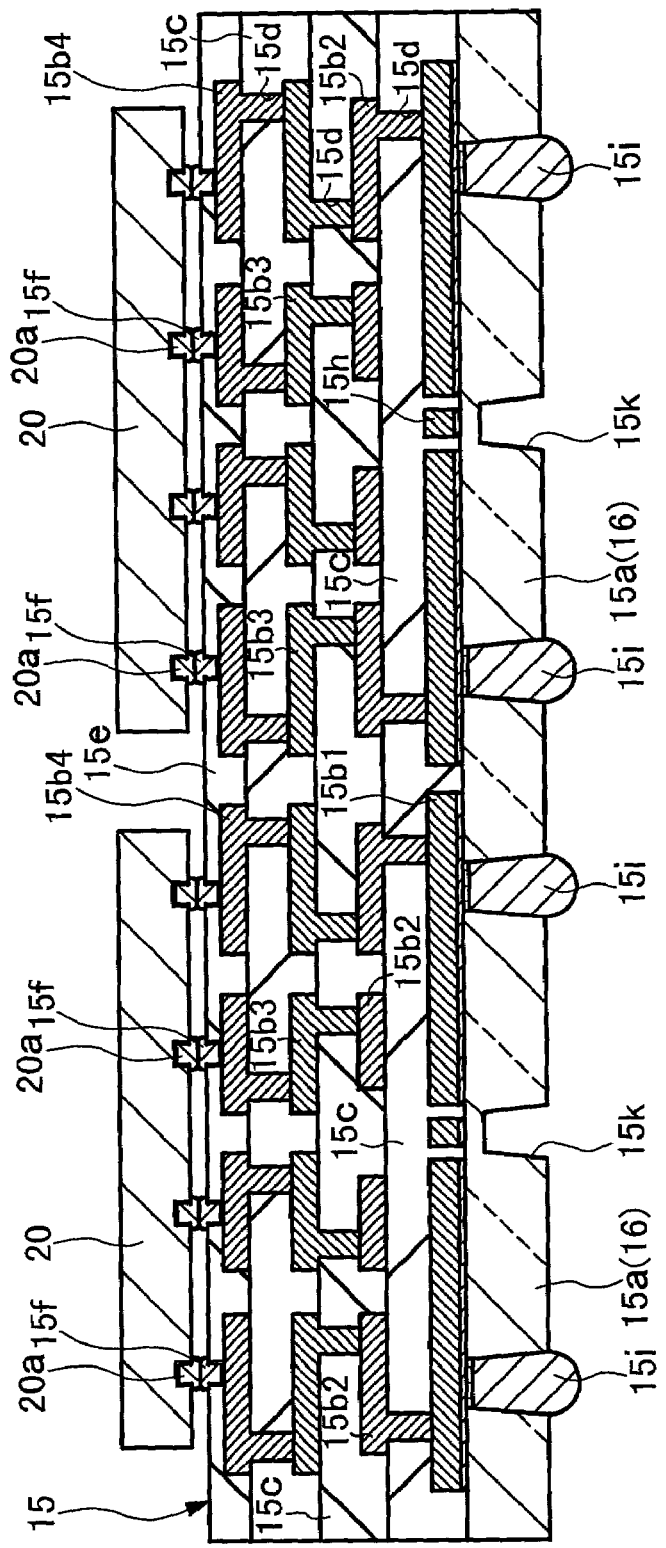
FIG. 19 is a cross-sectional view showing a semiconductor device manufactured by using the wiring substrate shown in FIG. 9.

FIG. 19 shows an example of constituting a multi-chip module by mounting a plurality of chips 20 each having integrated circuits formed thereon. Each of the chips 20 is mainly formed of, for example, monocrystalline silicon or the like. As an example of the multi-chip module, for example, there is the case where a memory circuit such as a DRAM (Dynamic Random Access Memory) or an SRAM (Static Random Access Memory) or the like is formed on predetermined chips 20, and a logic circuit such as a CPU (Central Processing Unit) or the like is formed on the other chips 20, and thereby a module such as a system LSI or the like as a whole is formed; or the case where the same memory circuit such as a DRAM or a SRAM or the like is formed on the chips 20, and thereby a memory module as a whole is formed; or the like.

Each electrical connection between the wiring substrate 15 and the chips 20 through the micro bumps 15$f$ and 20$a$ is established by Au/Sn eutectic (Au80/Sn20: 280° C., Au10/Sn90: 217° C.) or Au/Au thermo compression bonding (at 450 to 550° C.).

Also, each electrical connection described above may be established by Au/Si eutectic (Au98/Si2: 370° C.) junction, Au/Ge eutectic (Au88/Si12: 356° C.) junction, high temperature solder (Pb97.5/Ag2.5: 304° C.) reflow, Pb free solder(Sn96/Ag3.5/Cu0.5: 260° C.) reflow, W plug/In pool (In melting point: 156.6° C.) embodiment or the like.

Moreover, each electrical connection described above may be established by a surface active junction method using such a property that if the surfaces of metals are clean (in a high vacuum atmosphere) and the metals are made close to each other, the metals are coupled to each other at ordinary temperature. A combination of metallic materials can be exemplified by Al—Al, Al—Si, Cu—Sn, Si—GaAs, Si—InP, GaAs—InP and the like.

Figure 20:
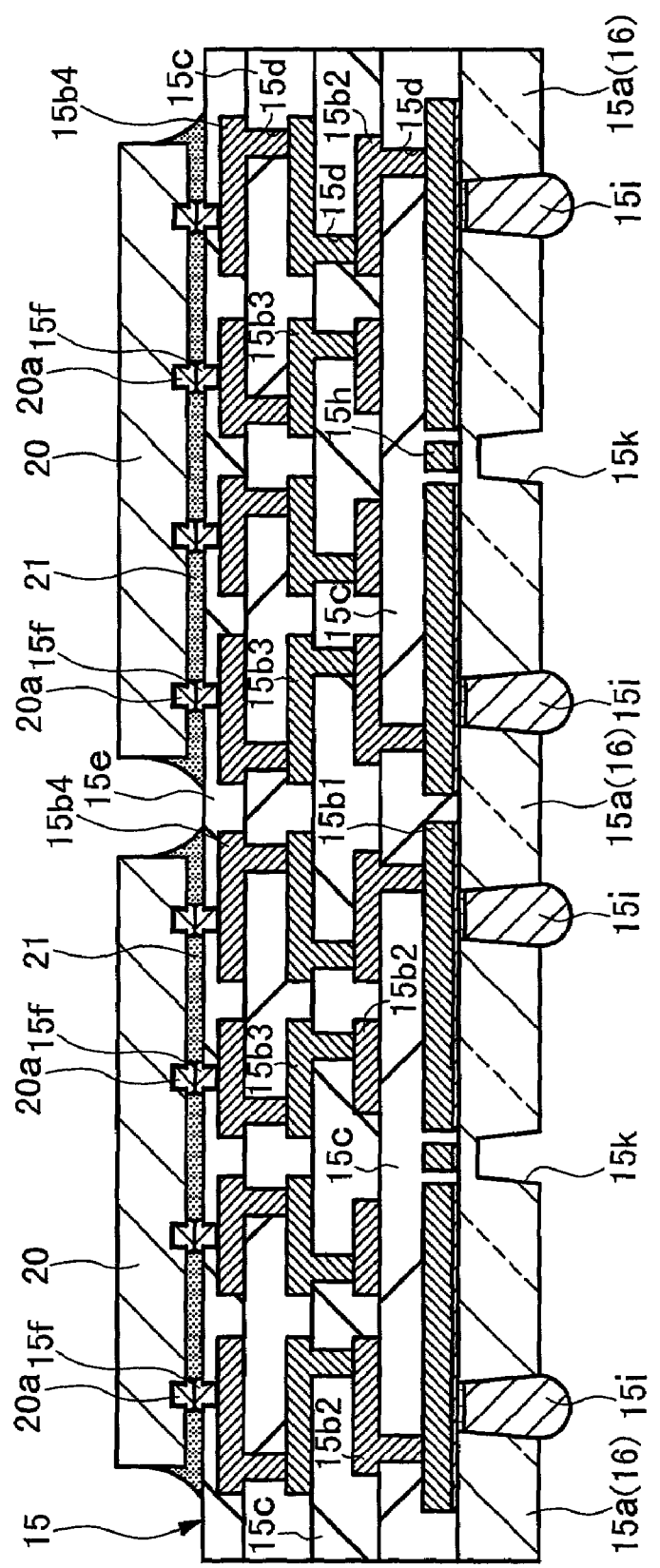
FIG. 20 is across-sectional view of a semiconductor device showing a modification of the semiconductor device shown in FIG. 19.
Figure 21:
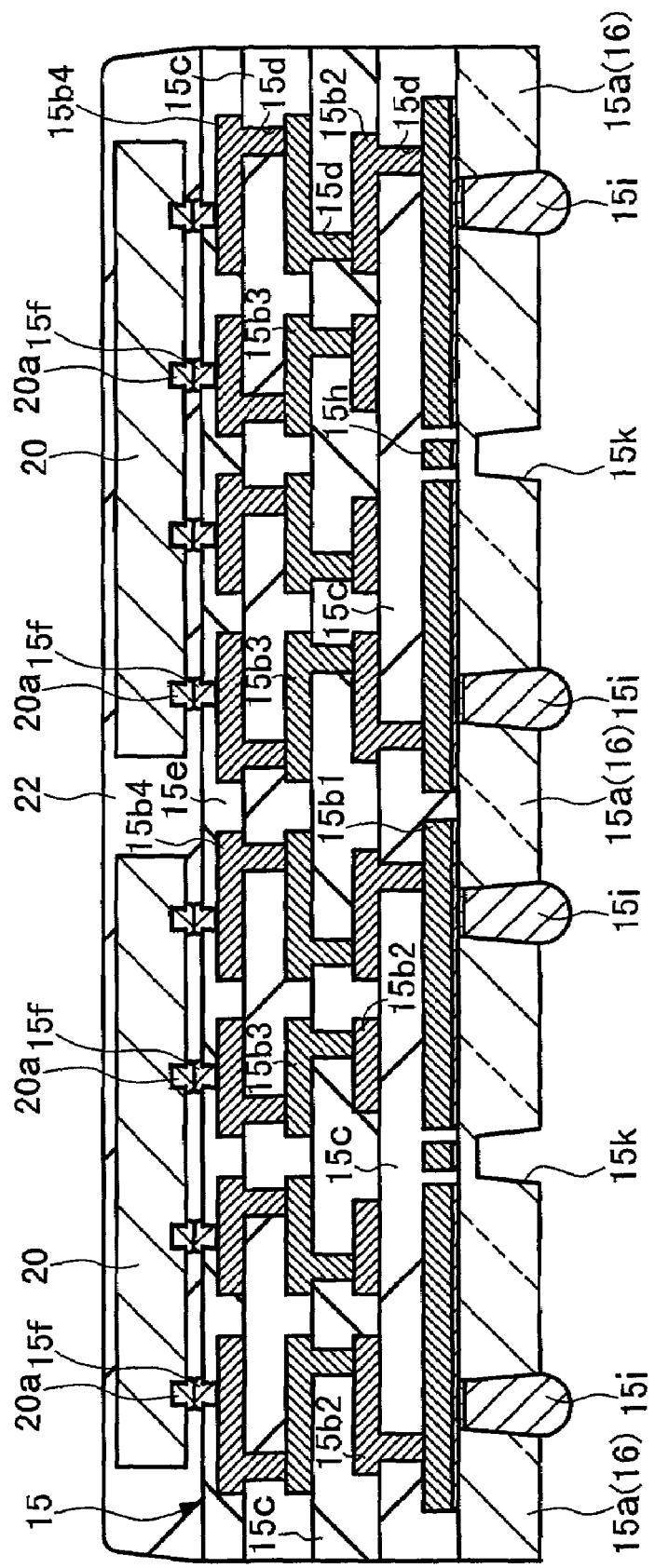
FIG. 21 is a cross-sectional view of a semiconductor device showing a modification of the semiconductor device shown in FIG. 19.

FIG. 20 shows an example in which a molding resin (under filling resin) 21 is filled between the chips 20 and the wiring substrate 15 in order to improve connection reliability of the micro bumps 15$f$ and 20$a$. FIG. 21 shows an example in which the chips 20 are sealed with a molding resin 22.

Figure 22:
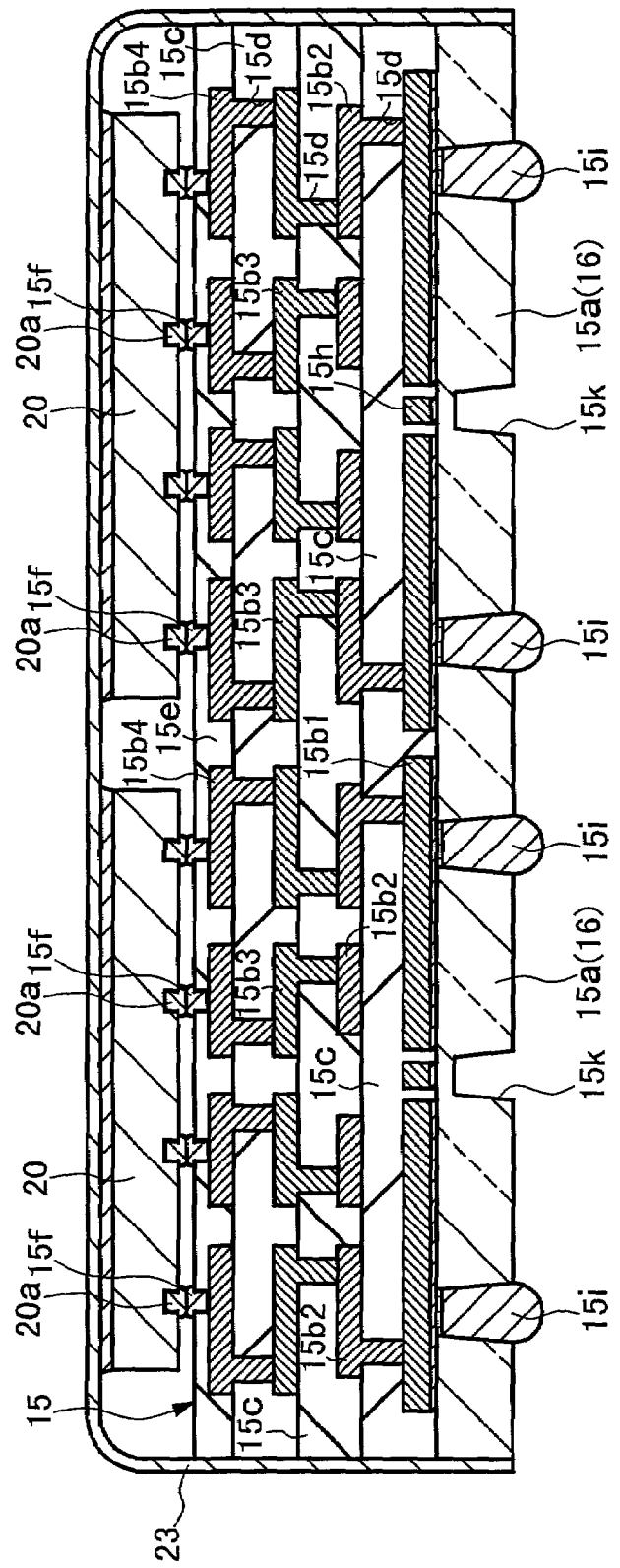
FIG. 22 is a cross-sectional view of a semiconductor device showing a modification of the semiconductor device shown in FIG. 19.

Further, if there is a probability that a memory LSI formed over the chip 20 malfunctions because of light entering from side faces of the glass substrate 15$a$, it is effective to seal the chips 20 with a cap 23 covering the side faces of the glass plate 15$a$ as shown in FIG. 22.

Figure 23:
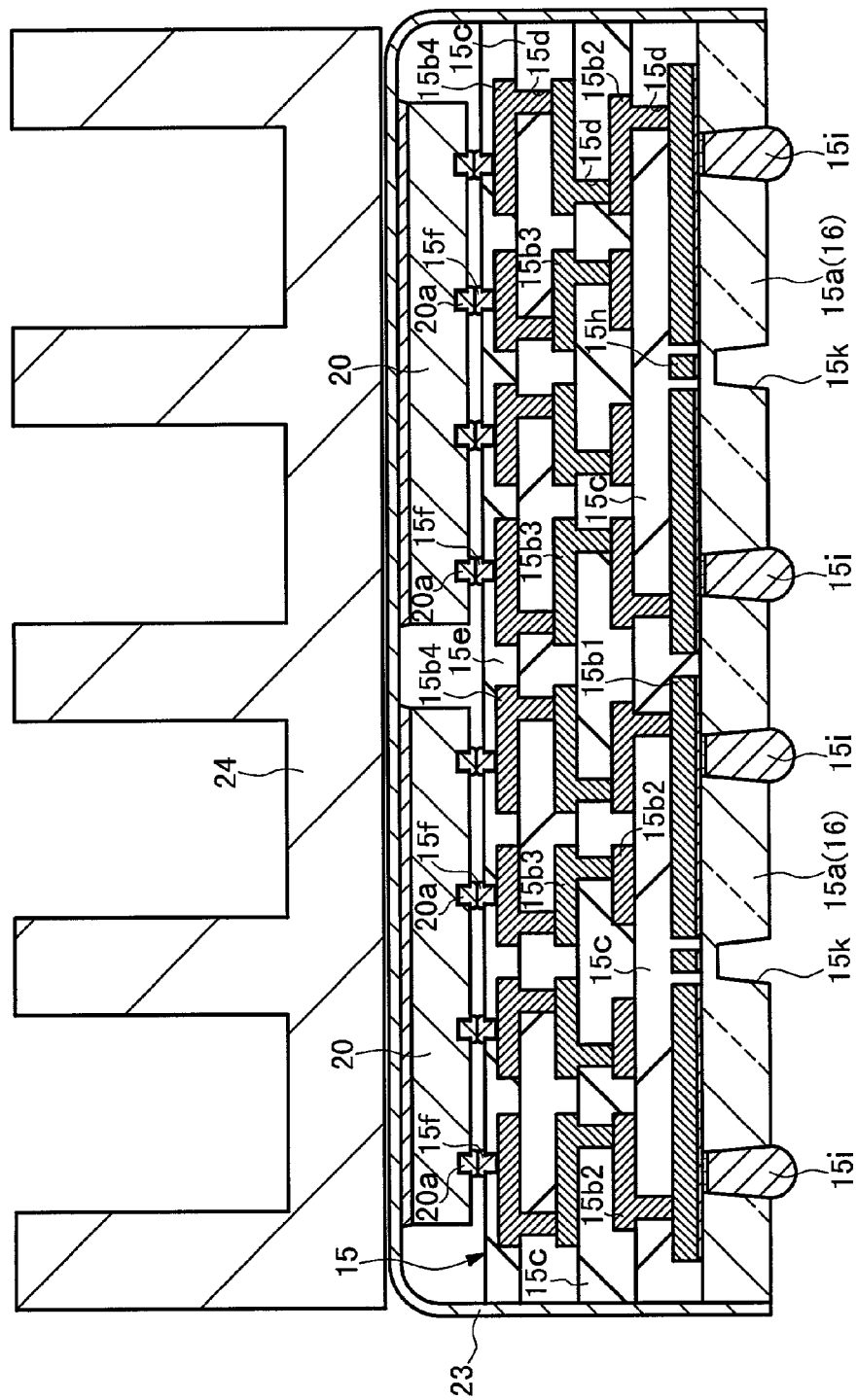
FIG. 23 is a cross-sectional view of a semiconductor device showing a modification of the semiconductor device shown in FIG. 19.

Also, as shown in FIG. 23, if a radiation fin 24 is attached to each rear surface (upper surface) side of the chips 20, it is possible to obtain a wiring substrate 15 having improved a radiative characteristic. The wiring substrate 15 according to this embodiment electrically connects the wirings 15$b$1 to 15$b$4 and the bump electrodes 15$i$, through the via holes 15$j$ formed in the glass plate 15$a$. Due to this, by utilizing these via holes 15$j$ as radiation paths (thermal vias), it is also possible to radiately discharge a part of heat generated by the chips 20, from the rear surface of the glass plate 15$a$ to the outside.

Moreover, a manufacturing line for the mask, which is employed in this embodiment, is annexed to a manufacturing line for the above-mentioned wiring substrate 15. By doing so, it is possible to reduce overhead time required for the packaging, handling and the like of the masks, and to more effectively utilize the short mask manufacturing TAT for the manufacturing of the wiring substrate.

(Second Embodiment)

Figure 24:
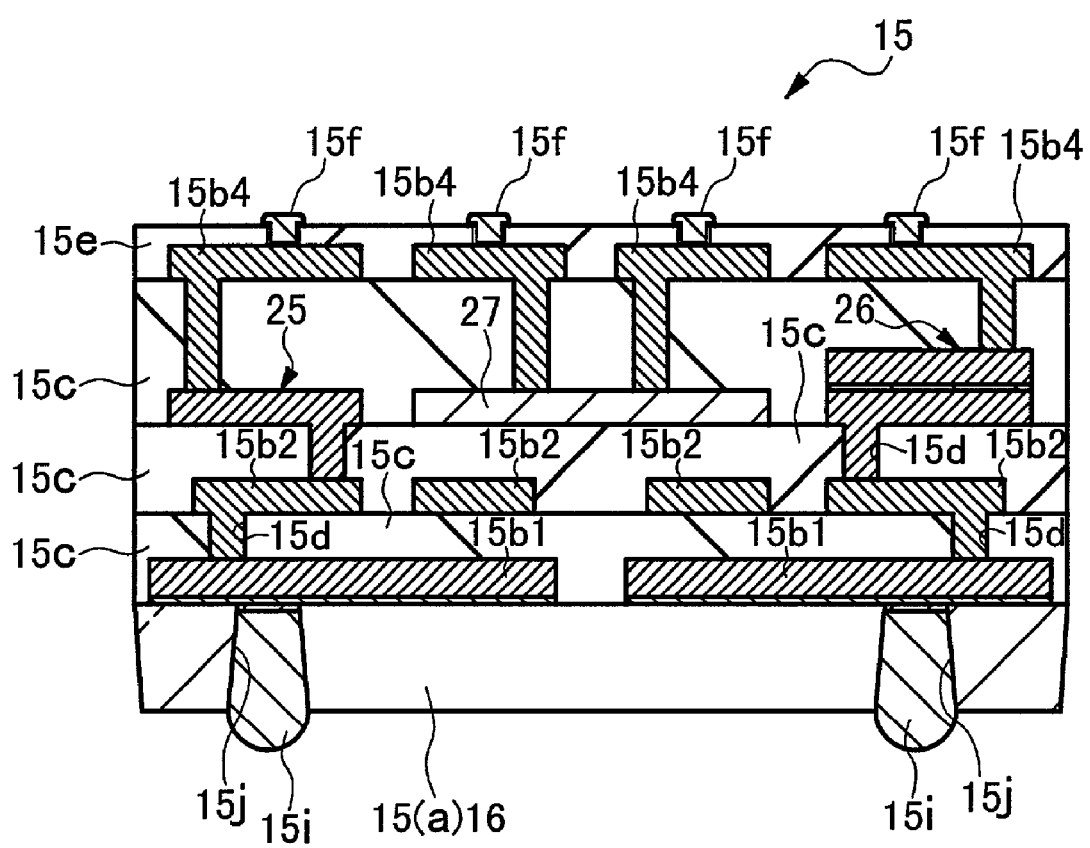
FIG. 24 is a cross-sectional view showing a wiring substrate that is yet another embodiment of the present invention.

FIG. 24 is a cross-sectional view showing a wiring substrate 15 that is the present embodiment. As shown in FIG. 24, passive elements such as a spiral coil 25, a capacitor 26, a resistor 27 and the like are formed in a part of the wiring substrate 15 that is the present embodiment.

The spiral coil 25 is formed by using a wiring material such as an Al alloy film or the like deposited by a sputtering method, and the resistor 27 is formed by using a polycrystalline silicon film or the like deposited by a CVD method. Also, a capacitive insulation film of the capacitor 26 is formed by using a $Ta_2O_5$ (tantalum pentoxide) film or the like deposited by a CVD method or an anodization method. In the case of performing a heat treatment to improve the film qualities of the polycrystalline silicon film, the $Ta_2O_5$ film and the like deposited over the glass plate 15$a$, these films are illuminated with laser or the like.

In the second embodiment, the above-stated mask M1 is employed in the exposure treatment for forming respective patterns of these passive elements. Needless to say, the above-mentioned masks M2 to M4 instead of the mask M1 may be employed.

As can be understood from the above, by forming the passive elements in a part of the wiring substrate 15, it is possible to realize a high value-added wiring substrate 15 having an improved operation characteristic and an improved noise-resistant characteristic.

As described above, the invention made by the inventors has been concretely explained based on the embodiments. However, the present invention is not limited to these embodiments described above, and, needless to say, various changes and modifications can be made without departing from the gist thereof.

For example, the shade patterns of the mask in the embodiments may be peeled off by peeling. Namely, the shade patterns of the mask may be peeled off by bonding an adhesive tape to the shade patterns of the mask and then peeling off the adhesive tape.

Furthermore, in the first and second embodiments, description has been given of the case where the substrate of the wiring substrate is a glass plate. The substrate used as the wiring substrate is not limited to the glass substrate, and various changes and modification can be made thereto. For example, semiconductor such as silicon or the like, or a resin such as a glass epoxy resin or the like, or a ceramic may be used as a substrate material of the wiring substrate. Additionally, the present invention can be applied to a method for manufacturing a wiring substrate using, as a substrate, a tape made of polyimide resin or the like.

The above description has been given mainly of the case where the invention made by the present inventors is applied to a wiring substrate manufacturing method belonging to a technical field that is thought to be the background of the invention. However, the present invention is not limited this case. For example, the present invention can also be applied to a magnetic disk head manufacturing method, a liquid crystal manufacturing method or a micromachine manufacturing method.

Advantages attained by the typical invention among the inventions disclosed by the present application will be briefly described as follows.

(1) By forming the wirings of the wiring substrate by an exposure treatment using a photomask which has shade patterns each containing at least nano particles and a binder, it is possible to manufacture photomasks required to form the wirings of the wiring substrate, in a short time. It is, therefore, possible to reduce the manufacturing TAT for the wiring substrate.

(2) Since the cost of each photomask required to form the wirings of the wiring substrate can be reduced by the exposure treatment using a photomask which has shade patterns each containing at least nano particles and a binder, it is possible to reduce the cost of the wiring substrate.

What is claimed is:

1. A wiring substrate manufacturing method comprising a step of forming a wiring of a wiring substrate which forming step includes a projection exposure treatment in which exposure light from photomask is transmitted through a projection lens to pattern a photoresist, the photomask having a shade pattern formed on a plate, said shade pattern containing at least nanoparticles and a binder, the nano particles comprising black pigment and the method further including a step of forming each of said shade patterns on said plate by printing a shade material containing said black of about 30% or more.

2. The wiring substrate manufacturing method according to claim 1, wherein said material contains said black pigment of 30% to 40%.

3. The wiring substrate manufacturing method according to claim 1, wherein said shade pattern corresponds to said wirings, respectively.

4. The wiring substrate manufacturing method according to claim 1, wherein an area of said shade pattern is smaller than an area of a light transmission region having no shade pattern.

5. The wiring substrate manufacturing method according to claim 1, further comprising the steps of:
   forming a line pattern for forming said wiring, in a thickness direction of a wiring substrate main body; and
   forming a hole pattern which is a pattern for forming said wirings and which connects, to one another, line patterns located on difference wiring layers.

6. The wiring substrate manufacturing method according to claim 1, wherein said nano particles consist of carbon.

7. The wiring substrate manufacturing method according to claim 1, further comprising a step of mounting one or a plurality of electronic components on a first surface of said substrate.

8. The wiring substrate manufacturing method according to claim 7, further comprising a step of mounting, while a second surface opposite to the first surface of said substrate faces a printed wiring substrate, the substrate on which said one or plurality of electronic components are mounted, on a printed wiring substrate.

9. The wiring substrate manufacturing method according to claim 1, wherein the plate having said shade pattern formed thereon is a glass plate.

10. The wiring substrate manufacturing method according to claim 1, wherein the nano-particles scatter light used by the exposure treatment.

11. The wiring substrate manufacturing method according to claim 10, wherein the nanoparticles are 200 nm or less in particle diameter.

12. The wiring substrate manufacturing method according to claim 11, wherein the binder comprises a resist material containing light absorber that absorbs exposure light.

13. The wiring substrate manufacturing method according to claim 1, wherein the binder comprises a resist material containing light absorber that absorbs exposure light.

14. The wiring substrate manufacturing method according to claim 1, wherein the shade pattern has a dimension on the order of μm.

* * * * *